(12) United States Patent
Nishibayashi et al.

(10) Patent No.: US 11,371,139 B2
(45) Date of Patent: Jun. 28, 2022

(54) METHOD OF MANUFACTURING DIAMOND, DIAMOND, DIAMOND COMPOSITE SUBSTRATE, DIAMOND JOINED SUBSTRATE, AND TOOL

(71) Applicant: Sumitomo Electric Industries, Ltd., Osaka (JP)

(72) Inventors: Yoshiki Nishibayashi, Itami (JP); Natsuo Tatsumi, Itami (JP); Hitoshi Sumiya, Itami (JP); Kazuo Nakamae, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 142 days.

(21) Appl. No.: 16/775,689

(22) Filed: Jan. 29, 2020

(65) Prior Publication Data

US 2020/0181800 A1 Jun. 11, 2020

Related U.S. Application Data

(62) Division of application No. 15/502,458, filed as application No. PCT/JP2015/072467 on Aug. 7, 2015, now Pat. No. 10,584,428.

(30) Foreign Application Priority Data

Aug. 8, 2014 (JP) ................................. 2014-162791

(51) Int. Cl.
*C23C 16/27* (2006.01)
*C23C 16/01* (2006.01)
(Continued)

(52) U.S. Cl.
CPC .............. *C23C 16/27* (2013.01); *C01B 32/25* (2017.08); *C23C 14/48* (2013.01); *C23C 16/01* (2013.01);
(Continued)

(58) Field of Classification Search
CPC ................................ C23C 16/27; C01B 32/25
(Continued)

(56) References Cited

U.S. PATENT DOCUMENTS

| 5,587,210 A | 12/1996 | Marchywka et al. |
| 2004/0182308 A1 | 9/2004 | Scarsbrook et al. |

(Continued)

FOREIGN PATENT DOCUMENTS

| CN | 101465271 A | 6/2009 |
| JP | H06-234595 A | 8/1994 |

(Continued)

OTHER PUBLICATIONS

International Search Report in counterpart International Application No. PCT/JP2015/072467, dated Nov. 10, 2015. [Cited in Parent].

(Continued)

*Primary Examiner* — Archene A Turner
(74) *Attorney, Agent, or Firm* — Baker Botts L.L.P.; Michael A. Ph Sartori D.

(57) ABSTRACT

A method of manufacturing a diamond by a vapor phase synthesis method includes: preparing a substrate including a diamond seed crystal; forming a light absorbing layer lower in optical transparency than the substrate by performing ion implantation into the substrate, the light absorbing layer being formed at a predetermined depth from a main surface of the substrate; growing a diamond layer on the main surface of the substrate by the vapor phase synthesis method; and separating the diamond layer from the substrate by applying light from a main surface of at least one of the diamond layer and the substrate to allow the light absorbing layer to absorb the light and cause the light absorbing layer to be broken up.

5 Claims, 2 Drawing Sheets

(51) Int. Cl.
  *C30B 29/04* (2006.01)
  *C23C 16/56* (2006.01)
  *C01B 32/25* (2017.01)
  *C30B 33/06* (2006.01)
  *C23C 16/02* (2006.01)
  *C23C 14/48* (2006.01)
  *C30B 25/18* (2006.01)
  *C30B 25/20* (2006.01)
  *C30B 31/22* (2006.01)
  *C30B 33/00* (2006.01)

(52) U.S. Cl.
  CPC .......... *C23C 16/02* (2013.01); *C23C 16/0272* (2013.01); *C23C 16/56* (2013.01); *C30B 25/186* (2013.01); *C30B 25/20* (2013.01); *C30B 29/04* (2013.01); *C30B 31/22* (2013.01); *C30B 33/00* (2013.01); *C30B 33/06* (2013.01)

(58) Field of Classification Search
  USPC ......................................................... 428/408
  See application file for complete search history.

(56) References Cited

U.S. PATENT DOCUMENTS

| | | |
|---|---|---|
| 2005/0118349 A1 | 6/2005 | Whitehead et al. |
| 2007/0017437 A1 | 1/2007 | Genis et al. |
| 2010/0000967 A1 | 1/2010 | Mokuno et al. |
| 2010/0206217 A1 | 8/2010 | Mokuno et al. |
| 2012/0302045 A1 | 11/2012 | Yamada et al. |
| 2015/0176155 A1 | 6/2015 | Ueda et al. |

FOREIGN PATENT DOCUMENTS

| | | | |
|---|---|---|---|
| JP | 2007-112637 A | | 5/2007 |
| JP | 2010-161359 A | | 7/2010 |
| JP | 2010-272879 A | | 12/2010 |
| JP | 2011-060860 A | | 3/2011 |
| JP | 2011-060862 A | | 3/2011 |
| JP | 2012-086988 | * | 5/2012 |
| JP | 2012-086988 A | | 5/2012 |
| JP | 2012-111654 | * | 6/2012 |
| JP | 2012-111654 A | | 6/2012 |
| JP | 2012-169363 A | | 9/2012 |
| TW | 201442168 A | | 11/2014 |
| WO | 2008/029736 A1 | | 3/2008 |
| WO | 2011/074599 A1 | | 6/2011 |
| WO | 2014003110 A1 | | 1/2014 |
| WO | 2014/087877 A1 | | 6/2014 |

OTHER PUBLICATIONS

Office Action in counterpart Chinese Patent Application No. 201580042702.9, dated Jul. 4, 2018. [Cited in Parent].

* cited by examiner

METHOD OF MANUFACTURING DIAMOND, DIAMOND, DIAMOND COMPOSITE SUBSTRATE, DIAMOND JOINED SUBSTRATE, AND TOOL

TECHNICAL FIELD

The present invention relates to: a method of manufacturing a diamond; a diamond; a diamond composite substrate; a diamond joined substrate; and a tool.

BACKGROUND ART

Diamond has many outstanding properties such as high hardness and high thermal conductivity, and additionally high light transmittance and wide bandgap. Diamond is therefore used widely as a material for: various tools including cutting tools such as drill, end mill, milling machine, cutter, and tool bit and abrasion-resistant tools such as die, jet nozzle for water or other fluids, and stichel; optics such as window and lens; semiconductor; and electronic components such as heat dissipation substrate. It is considered that diamond will become still more important in the future.

Recently, the vapor phase synthesis method (hereinafter also referred to as CVD (Chemical Vapor Deposition) method) has enabled formation of a synthetic diamond having a relatively large area, such as approximately six inches in diameter in the case of microwave-assisted plasma CVD method, and approximately 30 cm×30 cm in the case of hot filament CVD method. However, the vapor phase synthesis method grows a synthetic diamond on a substrate, and therefore, for applications which require only the diamond, it is necessary to remove the substrate and thereby extract only the diamond. In the case where a different-kind substrate made of a material different from diamond is used, diamond may be removed by the following method. Namely, a solution with which the different-kind substrate chemically reacts is used to dissolve the substrate and thereby extract only the diamond. This method makes use of the fact that diamond does not react with and is therefore not dissolved in most solutions. In contrast, in the case where monocrystalline or polycrystalline diamond is used for the substrate, special methods are required as described in the following.

Japanese Patent Laying-Open No. 6-234595 (PTD 1) discloses a method according to which the vapor phase synthesis method is used to alternately deposit a first diamond layer with high optical transparency and a second diamond layer with low optical transparency and thereby form a multilayer stack, and laser light is applied to the multilayer stack to allow the second diamond layer to absorb the laser light and thereby cause the first diamond layer to be separated as a diamond thin plate.

Japanese Patent Laying-Open No. 2007-112637 (PTD 2) discloses a method according to which the vapor phase synthesis method is used to grow, on a substrate, a first diamond layer with low optical transparency and a second diamond layer with high optical transparency and thereby obtain a multilayer stack, laser light is applied from the upper side or the lower side of the multilayer stack to transform the first diamond layer, and the transformed first diamond layer is subjected to treatment such as heat treatment, electrochemical etching, or acid etching and accordingly removed, to thereby separate the second diamond layer.

U.S. Pat. No. 5,587,210 (PTD 3) discloses a method according to which ions are implanted into a diamond substrate to form a damaged layer of non-diamond carbon in the substrate, thereafter diamond is grown on the substrate by the vapor phase synthesis method, and thereafter the damaged layer is electrochemically etched to separate the grown diamond from the substrate.

Japanese Patent Laying-Open No. 2011-060860 (PTD 4) discloses a method of slicing a substrate, according to which laser light is applied to a surface of the substrate to form a reformed layer in the substrate, and thereafter the reformed layer is etched to slice the substrate.

Japanese Patent Laying-Open No. 2012-169363 (PTD 5) discloses a method of treating a substrate, according to which laser light is applied to a surface of the substrate to form a reformed layer in the substrate, and thereafter the substrate is divided at the reformed layer or in the vicinity of the reformed layer.

Japanese Patent Laying-Open No. 2011-060862 (PTD 6) discloses a method of slicing a substrate, according to which laser light is applied to a surface of the substrate to form a reformed layer in the substrate, thereafter a groove is formed in the reformed layer, and the substrate is removed along the groove.

CITATION LIST

Patent Document

PTD 1: Japanese Patent Laying-Open No. 6-234595
PTD 2: Japanese Patent Laying-Open No. 2007-112637
PTD 3: U.S. Pat. No. 5,587,210
PTD 4: Japanese Patent Laying-Open No. 2011-060860
PTD 5: Japanese Patent Laying-Open No. 2012-169363
PTD 6: Japanese Patent Laying-Open No. 2011-060862

SUMMARY OF INVENTION

Technical Problem

Regarding the method of PTD 1, in order to sufficiently cleave, by the laser light, the second diamond layer absorbing the laser light, it is necessary to break the bond of diamond which is hardest among the materials. For such cleaving, the intensity of the laser light must be kept sufficiently strong. At this time, at the surface of the first diamond layer which is intended to transmit the laser light, the intensity of the laser light may partially exceed a treatment threshold value, due to influences of dust on the surface or unevenness of the surface, to thereby cause the first diamond layer to be also treated. Moreover, because the second diamond layer is suddenly cleaved, the force of cleaving may cause the boundary of cleaving to be extended into the first diamond layer, resulting in a problem that the surface of the separated layer is rough. Moreover, the impact of the treatment may cause the whole diamond to be broken.

The method of PTD 2 is required to form a transformed layer in the diamond. However, the whole diamond is broken highly frequently due to the same reason as that of PTD 1, and etching of the transformed layer is difficult for the same reason as that of PTD 3 and PTD 4 as described below. Regarding PTD 3 and PTD 4, the layer to be etched (hereinafter also referred to damaged layer) is considerably small in thickness, and therefore, the speed at which an etching solution penetrates into the damaged layer is considerably low. Therefore, in the case of a substrate having a greater size, the speed at which the diamond is separated therefrom is significantly lower, resulting in a problem of increase of the production cost. In some cases, the solution fails to penetrate into the damaged layer, which makes it impossible to separate diamond.

Regarding PTD 5 and PTD 6, a physical force is applied to the reformed layer to separate the substrate, and therefore, there is a problem that the surface of the resultant substrate is likely to be rough. Moreover, if the thickness of the substrate is not sufficiently large relative to the size thereof, there is a problem that the substrate is broken.

In view of the above, an object is to provide a method of manufacturing a diamond that enables a substrate to be separated, in a short time, from diamond which is grown on the substrate by the vapor phase synthesis method, further enables this separation even when the substrate or the grown diamond is thin or even when the size of the substrate is large, and provides respective flat surfaces of the substrate and the diamond that are separated from each other. In addition, an object is to provide a diamond which is excellent as a material for a tool, a diamond composite substrate including the diamond, a diamond joined substrate, and a tool for which the diamond is used.

Solution to Problem

A method of manufacturing a diamond according to an aspect of the present invention is a method of manufacturing a diamond by a vapor phase synthesis method. The method includes: preparing a substrate including a diamond seed crystal; forming a light absorbing layer lower in optical transparency than the substrate by performing ion implantation into the substrate, the light absorbing layer being formed at a predetermined depth from a main surface of the substrate; growing a diamond layer on the main surface of the substrate by the vapor phase synthesis method; and separating the diamond layer from the substrate by applying light from a main surface of at least one of the diamond layer and the substrate to allow the light absorbing layer to absorb the light and cause the light absorbing layer to be broken up. According to this aspect, the diamond layer is higher in optical transparency than the light absorbing layer in the case where the light is applied from the main surface of the diamond layer in the step of separating the diamond layer from the substrate. In contrast, in the case where light is applied from the main surface of the substrate, the diamond layer may either be higher or lower in optical transparency than the light absorbing layer.

A method of manufacturing a diamond according to an aspect of the present invention is a method of manufacturing a diamond by a vapor phase synthesis method. The method includes: preparing a substrate including a diamond seed crystal; forming a light absorbing layer on a main surface of the substrate by the vapor phase synthesis method, the light absorbing layer being lower in optical transparency than the substrate, having a maximum peak value of a density of atomic vacancies in a range of not less than 0.01% and not more than 20% or having a total atomic concentration of not less than 0.1 ppm and not more than 10% of carbon atoms and different-kind atoms which do not bond with carbon forming a diamond lattice; growing a diamond layer on a main surface of the light absorbing layer by the vapor phase synthesis method; and separating the diamond layer from the substrate by applying light from a main surface of at least one of the diamond layer and the substrate to allow the light absorbing layer to absorb the light and cause the light absorbing layer to be broken up. According to this aspect, the diamond layer is higher in optical transparency than the light absorbing layer in the case where the light is applied from the main surface of the diamond layer in the step of separating the diamond layer from the substrate. In contrast, in the case where light is applied from the main surface of the substrate, the diamond layer may either be higher or lower in optical transparency than the light absorbing layer.

A diamond according to an aspect of the present invention includes: a diamond layer; and a light absorbing layer disposed on one surface of the diamond layer and different in optical transparency from the diamond layer, and a surface of the light absorbing layer includes at least one of a diamond crack having a length of not more than 100 μm, a graphite layer having a maximum diameter of not more than 100 μm, and a graphite layer having a length of not less than 200 μm.

A diamond according to an aspect of the present invention includes: a diamond layer; and a light absorbing layer disposed on one surface of the diamond layer and different in optical transparency from the diamond layer, and a surface of the light absorbing layer includes at least one of a depression, a substantially circular region exposing the diamond layer, and a substantially circular graphite layer.

A diamond according to an aspect of the present invention includes: a diamond layer; and a light absorbing layer disposed on one surface of the diamond layer and different in optical transparency from the diamond layer, and crystal strain of the light absorbing layer is transferred to a part of the diamond layer.

A diamond composite substrate according to an aspect of the present invention includes: a diamond as described above; and a different-kind substrate attached to the diamond, the different-kind substrate being a substrate of a material different from diamond.

A diamond joined substrate according to an aspect of the present invention includes: a substrate having a light absorbing layer and including a diamond seed crystal; and a diamond layer disposed on a main surface of the substrate. The light absorbing layer includes different-kind atoms which do not bond with carbon of a diamond lattice, and the different-kind atoms are atoms of at least one kind of element selected from the group consisting of hydrogen, nitrogen, oxygen, helium, neon, and argon.

A tool according to an aspect of the present invention is a tool for which the above-described diamond is used.

Advantageous Effects of Invention

According to the above-described aspect, there can be provided a method of manufacturing a diamond that enables separation of the substrate and the diamond from each other in a short time, and makes respective separated surfaces of the substrate and the diamond flat. Rather than the method that directly breaks highly strong diamond bonds by applied light, the method according to the above-described aspect breaks diamond bonds in advance by implanting ions in the form of a layer before applying light, or produces a condition where diamond bonds are broken in the form of a layer when diamond is synthesized. After this, light is caused to act on only the light absorbing layer having many atomic vacancies and low optical transparency to expand only the light absorbing layer by different elements present in the light absorbing layer and thereby enable separation of the substrate and the diamond from each other with a significantly low power.

As compared with the method that forms a graphite layer by ion implantation and thereafter causes separation from the substrate by electrochemical etching, the method according to the above aspect makes it possible to separate a large substrate having a diameter of 12 mm, 25 mm, 50 mm, or more than 75 mm. Moreover, since the ion implantation dose is low, an epitaxial layer formed after ion implantation is excellent in crystallinity. Further, it is also possible to separate an electrically conductive substrate or separate diamond to which an electrically conductive material is joined, which is impossible by electrochemical etching. For example, separation from a tool (diamond is joined to a shank of the tool) is also possible.

According to the above aspect, the substrate and the diamond can be separated from each other at room temperature and the diamond separated in the form of a layer or plate is hardly thermally affected, and therefore, the method is applicable to situations where problems occur at a temperature exceeding 100° C. For example, the diamond with a joint or joined substrate which cannot be maintained usually at such a temperature, or the diamond soldered to a substrate or joined to a shank of a tool or the like can be separated. Moreover, a disadvantage that the properties of the diamond itself are slightly changed at a high temperature of 1000° C. or more can be prevented.

According to the above aspects, there can be provided a diamond excellent for use as a tool material, a diamond composite substrate including the diamond, a diamond joined substrate, and a tool for which the diamond is used.

DESCRIPTION OF EMBODIMENTS

Description of Embodiments of the Invention

Figure 1A:
FIG. 1 (A) to FIG. 1 (E) are diagrams schematically illustrating a method of manufacturing a diamond according to an aspect of the present invention.
Figure 1B:
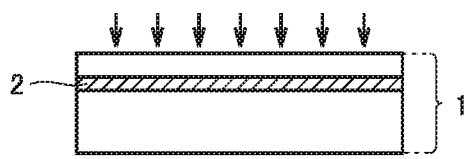

Initially, aspects of the present invention will be described one by one.

A method of manufacturing a diamond according to an aspect of the present invention is:

(1) a method of manufacturing a diamond by a vapor phase synthesis method, including: preparing a substrate including a diamond seed crystal; forming a light absorbing layer lower in optical transparency than the substrate by performing ion implantation into the substrate, the light absorbing layer being formed at a predetermined depth from a main surface of the substrate; growing a diamond layer on the main surface of the substrate by the vapor phase synthesis method; and separating the diamond layer from the substrate by applying light from a main surface of at least one of the diamond layer and the substrate to allow the light absorbing layer to absorb the light and cause the light absorbing layer to be broken up. The diamond layer grown by the vapor phase synthesis method is higher in optical transparency than the light absorbing layer in the case where the light is applied from the main surface of the diamond layer in the step of separating the diamond layer from the substrate. In contrast, in the case where light is applied from the main surface of the substrate, the diamond layer may either be higher or lower in optical transparency than the light absorbing layer. This is for the reason that as long as the seed substrate is made of diamond higher in optical transparency than the light absorbing layer, the seed substrate enables the light applied from the substrate to reach the light absorbing layer in the step of separating the diamond layer from the substrate.

The essence of this aspect is that diamond bonds are broken in advance by ion implantation, rather than that the diamond bonds are broken by applied light such as laser light or that a reformed or transformed layer is formed in advance in the diamond by application of light such as laser light. Although each atom implanted by the ion implantation has high energy, a single atom is small and therefore the overall energy applied to the diamond by the ion implantation is small. Namely, although the energy of a single atom is enough to break carbon-carbon bonds forming the diamond, the energy of a single atom is significantly smaller than the energy that causes the whole diamond to be broken. Under such a situation, energy is given by applying light such as laser light to atoms introduced into the diamond by the ion implantation, to thereby evaporate and expand or simply expand the atoms so as to break only the ion-implantation interface where carbon-carbon bonds are weakened. According to this aspect, the substrate and the diamond grown thereon can be separated from each other with significantly smaller energy as compared with the conventional method that breaks diamond bonds by laser light only.

The method of manufacturing a diamond according to this aspect is completely different from the conventional art in that the action such as direct transformation or cleavage caused to the diamond by application of light (including laser light) is not used. Means for forming a different layer (layer which is lower in optical transparency) in the diamond is ion implantation rather than application of light. Before applying light from the main surface of at least one of the diamond layer and the substrate, a layer with lower optical transparency is formed in advance within the diamond.

Through the ion implantation, atoms of an element different from carbon are introduced into the substrate including diamond seed crystal, or defects weakening diamond bonds are introduced into the substrate, or the substrate is transformed into graphite. Atoms introduced into the substrate including diamond seed crystal may be atoms of carbon, boron, or phosphorus which are effective as long as they are capable of breaking diamond bonds. Preferably, atoms of an element different from carbon that are easily gasified are used. Since the ion implantation causes atoms of a different element or defects to be introduced into the substrate, the surface of the substrate maintains the diamond structure. Therefore, after a layer with lower optical transparency is formed by the ion implantation, a diamond layer can be formed on the substrate.

As the light to be applied, low-power light that acts only on a different element in the diamond or on graphite in the diamond and that does not directly cleave the diamond may be used. Therefore, the applied light will not break the diamond other than the layer with relatively lower optical transparency.

The applied light acts on a certain amount of a different element or a graphite layer in the diamond to increase the energy of the element or graphite layer, and thereby cause at least one of the different element or the graphite carbon to expand and act on the diamond. Thus, a layer portion weakened due to the presence of vacancies in the diamond is forced to expand. As long as there is a certain amount of a different element, the graphite layer is unnecessary.

The applied light may scan like laser light. If the energy is enough, the whole surface may be irradiated at a time with the light. While the light may be concentrated at the layer with lower optical transparency, the light may not be concentrated since the difference in degree of absorption is generated in advance. In this case, even when the position where the light is concentrated is deviated to some extent, the light performs the same function. In any case, the energy is absorbed only locally at the light concentration point or in the light absorbing layer in a short time and does not affect the temperature of the whole. These characteristics enable the light to be applied at room temperature or in a liquid having a low melting point. This does not mean that heat at any temperature other than room temperature should not be used. For example, to the substrate set in advance to any temperature such as −50° C., 100° C., 200° C., the present invention may be applied.

Regarding the method of manufacturing a diamond according to an aspect of the present invention, the light absorbing layer is allowed to absorb light and thereby break up. This is accomplished not by the method that breaks diamond bonds by light (cleavage method), but by gasifying and thereby expanding atoms of a different element or carbon in graphite in the light absorbing layer so as to separate the diamond layer from the substrate. Therefore, as compared with the method that cleaves diamond, the diamond layer can be separated from the substrate in a shorter time, since light can be applied with a lower power to a greater region (beam size).

Moreover, since the light absorbing layer is formed by the ion implantation, the light absorbing layer is weaker than other regions due to atomic vacancies generated in the light absorbing layer, and force is uniformly applied to the plane of the vacancies. Accordingly, after the light absorbing layer is broken up, respective separated surfaces of the substrate and the diamond layer are flat. A smaller thickness of the light absorbing layer and a greater amount of atomic vacancies are preferred since they increase the degree of flatness. However, an excessively small thickness of the light absorbing layer hinders an adequate separation force from being generated, and an excessively great amount of atomic vacancies deteriorates the diamond structure in the outermost surface of the substrate, which makes it impossible to form diamond on the substrate. Thus, the dose of the ion implantation should fall within an appropriate range.

(2) The light absorbing layer has a thickness of preferably not less than 20 nm and not more than 10 μm, more preferably not less than 50 nm and not more than 5 μm, and has a maximum peak value of a density of atomic vacancies in a range of not less than 0.01% and not more than 100%. More preferably, the light absorbing layer has a thickness of not less than 100 nm and not more than 1 μm, and has a density of atomic vacancies in a range of not less than 0.1% and not more than 80%. Accordingly, the time for separating the substrate and the diamond from each other is shortened relative to the method that directly cleaves diamond or the method that electrochemically etches the graphite layer. The thickness of the light absorbing layer and the atomic vacancies thereof can be designed through a common simulation of ion implantation. If the density of atomic vacancies is higher than 10%, the graphite is in the form of a layer, namely a graphite layer is formed. If the density of atomic vacancies is higher than 50%, the transmittance is less than 1% and the light absorbing layer does not substantially transmit light. The density of atomic vacancies refers to the value determined by dividing the atomic density generated in a Monte Carlo simulation by an ideal diamond carbon density. Therefore, it is numerically possible that the density of atomic vacancies is 100%, which indicates a graphite layer. Graphite does not refer to crystalline graphite but broadly refers to a layer having a broad peak in the vicinity of 1500 to 1600 cm$^{-1}$ based on the Raman spectroscopy.

(3) The ion implantation is performed preferably with ions of at least one kind of element selected from the group consisting of hydrogen, oxygen, nitrogen, helium, neon, and argon. As such ions, for example, hydrogen ions, hydrogen molecular ions, oxygen ions, oxygen molecular ions, nitrogen ions, nitrogen molecular ions, helium ions, neon ions, and argon ions, and the like may be used. These ions are easily gasified by indirectly or directly absorbing light energy. The element implanted by the ion implantation is preferably an element to be gasified, since most of the incident energy is converted into expansion energy. The ratio of atoms which do not bond with carbon atoms of the diamond lattice in the light absorbing layer, to the atoms of implanted ions, is not less than 1 ppm, preferably not less than 10 ppm, and more preferably not less than 100 ppm, and not more than 80%, preferably not more than 30%, and more preferably not more than 10%. The fact that the implanted atoms do not easily bond with carbon or the implanted atoms are in the condition that does not easily allow the implanted atoms to bond with carbon is important. Although other ions may absorb energy to evaporate into gas, the energy efficiency is low. Therefore, when the light absorbing layer includes the aforementioned ions, these ions are gasified to expand when the light absorbing layer absorbs light, which further promotes breakage of the light absorbing layer.

When boron, nitrogen, silicon, and phosphorus form four coordinate bonds with carbon in diamond, energy equivalent to the energy for breaking diamond bonds is necessary. This is therefore ineffective. However, this is effective when the aforementioned elements are used only for breaking diamond crystal bonds, like carbon ion implantation. Whether or not diamond crystal bonds have been broken can be determined depending on whether or not a graphite layer has been formed (whether or not the density of atomic vacancies is not less than 10% or the transmittance is not more than 40%). Agglomerated nitrogen without forming four coordinate bonds or interlattice nitrogen is easily gasified and effective. Whether or not nitrogen substitutes for carbon in the lattice can be determined by comparing the amount of ESR (Electron Spin Resonance) detected for the substitution type with the total amount of nitrogen based on the SIMS (Secondary Ion Mass Spectrometry). When different-kind atoms which are different in kind from nitrogen atoms are introduced by the ion implantation, the crystallinity of the lattice is considerably destroyed and therefore 50% or more of the implanted atoms does not bond with carbon atoms in the lattice. This is determined from a comparison between the distribution of implanted atoms immediately after the ion implantation and the distribution of atoms after hydrogen plasma treatment for removing amorphous components after the ion implantation, namely determined based on the fact that the implanted atoms have been decreased by 50% or more. When the ion implantation introduces, into the diamond crystal lattice, atoms or molecules which are easily vaporized and which do not form four coordinate bonds, these ions are gasified to expand, which is advantageous to breakage of the light absorbing layer.

(4) The light absorbing layer preferably includes atoms implanted by the ion implantation, the atoms being at an atomic concentration of not less than 0.1 ppm and not more than 30%. Accordingly, carbon-carbon bonds in the light absorbing layer have sufficiently been weakened, which is advantageous to breakage of the light absorbing layer by application of light.

(5) A method of manufacturing a diamond according to an aspect of the present invention is a method of manufacturing a diamond by a vapor phase synthesis method, including: preparing a substrate including a diamond seed crystal; forming a light absorbing layer on a main surface of the substrate by the vapor phase synthesis method, the light absorbing layer being lower in optical transparency than the substrate, having a maximum peak value of a density of atomic vacancies in a range of not less than 0.01% and not more than 20% or having a total atomic concentration of not less than 0.1 ppm and not more than 10% of carbon atoms and different-kind atoms which do not bond with carbon forming a diamond lattice; growing a diamond layer on a main surface of the light absorbing layer by the vapor phase synthesis method; and separating the diamond layer from the substrate by applying light from a main surface of at least one of the diamond layer and the substrate to allow the light absorbing layer to absorb the light and cause the light absorbing layer to be broken up. The diamond layer grown by the vapor phase synthesis method is higher in optical transparency than the light absorbing layer in the case where the light is applied from the main surface of the diamond layer in the step of separating the diamond layer from the substrate. In contrast, in the case where light is applied from the main surface of the substrate, the diamond layer may either be higher or lower in optical transparency than the light absorbing layer. This is for the reason that as long as the seed substrate is made of diamond higher in optical transparency than the light absorbing layer, the seed substrate enables the light applied from the substrate to reach the light absorbing layer in the step of separating the diamond layer from the substrate.

The vapor phase synthesis method can introduce, into a layer synthesized on the seed substrate, hydrogen atoms or atoms of another different element or defects, by controlling synthesis conditions or introducing a different element during synthesis. The common vapor phase synthesis method, however, does not form a light absorbing layer having a maximum peak value of a density of atomic vacancies in a range of not less than 0.01% and not more than 20% or having a total atomic concentration of not less than 0.1 ppm and not more than 10% of carbon atoms and different-kind atoms which do not bond with carbon forming a diamond lattice, namely the light absorbing layer in the present embodiment. The method used for the present embodiment differs from the conventional method.

In the case where boron, nitrogen, aluminum, silicon, phosphorus, or the like is introduced, basically the conventional method substitutes the introduced element for a carbon atom and thereby introduces the element into the lattice position. Therefore, substantially no atomic vacancy is generated. In the case of this method, the introduced atoms form strong bonds with carbon atoms.

In contrast, in the present embodiment, different-kind atoms are introduced together with atomic vacancies even into the diamond crystal lattice with short bonds, during growth. Namely, there has been found a method that intentionally introduces kink or step at least five times as large as the atomic level to thereby introduce a relatively large amount of different-kind atoms together with atomic vacancies. This method is used to form the light absorbing layer in the present embodiment. The light absorbing layer has a maximum peak value of the density of atomic vacancies of not less than 0.01%, preferably not less than 0.1%, and not more than 20%, preferably not more than 10%. Alternatively, the light absorbing layer has a total atomic concentration of not less than 0.1 ppm, preferably not less than 1 ppm, more preferably not less than 10 ppm, and not more than 10%, preferably not more than 5%, more preferably not more than 1%, of carbon atoms and different-kind atoms which do not bond with carbon forming a diamond lattice.

When there are different-kind atoms which do not bond with carbon in the diamond lattice, the density of atomic vacancies is increased due to the influence of the different-kind atoms. As to helium, neon, and argon, they do not bond with carbon because these elements have no available bond. As to hydrogen, nitrogen, and oxygen, whether such an element bonds with carbon can be determined by comparing the result of analysis by the ESR method or analysis of infrared absorption combination vibration with the result of SIMS analysis from which the total atomic concentration is derived. The substitution-type nitrogen analyzed by the ESR method or atom analyzed based on infrared absorption (C—H, C—O, or C—N vibration) bonds with carbon. In contrast, the SIMS analysis can detect all atoms including atoms which do not bond with carbon. Therefore, respective analysis results can be compared with each other to confirm whether or not atoms bonding with carbon are present in the diamond lattice.

Increase of a non-diamond phase in the light absorbing layer is accompanied by increase of sp2 bonds and thus electrical conductivity. In such a state, different-kind atoms do not bond with carbon of the lattice. If different-kind atoms which do not bond with carbon of the lattice are less than 0.1 ppm, separation from the seed substrate by expansion caused by absorption of light is impossible. Unlike the ion implantation method, the vapor phase synthesis method cannot form a light absorbing layer made of 100% of a graphite layer in the substrate. This is for the reason that after formation of a graphite layer, a diamond layer cannot be formed on the graphite layer. In the case of the ion implantation method, atomic vacancies are introduced into the crystal. Therefore, the ion implantation method can produce a condition in which there are many atomic vacancies as well as many carbon atoms and different-kind atoms which do not bond with carbon in the lattice. In contrast, when the light absorbing layer is to be formed by the vapor phase synthesis method, it is necessary to synthesize a crystalline diamond on the light absorbing layer, and therefore, it is necessary to provide an appropriate amount of atomic vacancies in the light absorbing layer and an appropriate amount of carbon atoms and different-kind atoms which do not bond with carbon in the lattice in the light absorbing layer. Accordingly, formation of the light absorbing layer by the ion implantation method differs from formation of the light absorbing layer by the vapor phase synthesis method in terms of the optimum value of the amount of atomic vacancies in the light absorbing layer and the optimum value of the amount of carbon atoms and different-kind atoms which do not bond with carbon in the lattice.

The method of manufacturing a diamond according to an aspect of the present invention allows the light absorbing layer to absorb light and thereby breaks up only the light absorbing layer so as to separate the diamond layer from the substrate as described above. Therefore, the diamond layer can be separated from the substrate efficiently in a short time. Moreover, this method can make the resultant surface of the diamond layer flat.

(6) Preferably, the different-kind atoms which do not bond with carbon of the diamond lattice in the light absorbing layer are atoms of at least one kind of element selected from the group consisting of hydrogen, nitrogen, oxygen, helium, neon, and argon. Since atoms of these elements are vaporized to expand by applied light, they are advantageous to breakage of the light absorbing layer by forcing to expand a layer region in the diamond which has been weakened due to the presence of vacancies.

(7) The light is pulsed light, and an irradiation fluence per pulse on the main surface of at least one of the diamond layer and the substrate irradiated with the light is preferably not less than 0.001 J/mm$^2$ and not more than 800 J/mm$^2$, more preferably not less than 0.01 J/mm$^2$ and not more than 800 J/mm$^2$, and still more preferably not less than 0.1 J/mm$^2$ and not more than 800 J/mm$^2$. The pulse width is preferably 0.01 psec to 10 msec, more preferably 0.1 nsec to 1 msec. The lower limit of the pulse interval is preferably 1 nsec, more preferably 1 μsec, and still more preferably 10 μsec. The upper limit of the pulse interval is preferably 1 sec, more preferably 10 msec, and still more preferably 1 msec. The lower limit of the repetition frequency is preferably 1 Hz, more preferably 100 Hz, and still more preferably 1 kHz. The upper limit of the repetition frequency is preferably 1000 MHz, more preferably 1000 kHz, and still more preferably 100 kHz. The ratio between the pulse width and the pulse interval, namely the ratio: interval/width, is preferably 10 to 10$^9$, more preferably 10 to 10$^6$, and still more preferably 10 to 1000. Under the above conditions, the pulsed light will not break the main surface of the diamond layer and that of the substrate. Moreover, no crack is generated in the substrate and the diamond layer, and only the light absorbing layer can be broken up.

(8) Preferably, the light is pulsed light, and a pulse energy on the main surface of at least one of the diamond layer and the substrate irradiated with the light is not less than 0.05 mJ and not more than 100 mJ. The pulsed light can be used to stop application of the light before the temperature of the whole diamond increases, and restart application of the light after the diamond is cooled down, and therefore can increase the temperature of only the light absorbing layer. When the pulse energy is less than 0.05 mJ, the applied light cannot break up the light absorbing layer. In contrast, when the pulse energy is more than 100 mJ, there is a possibility that the applied light breaks up the diamond layer or substrate other than the light absorbing layer. The pulse energy is more preferably not less than 0.1 mJ and not more than 20 mJ, and still more preferably not less than 0.3 mJ and not more than 3 mJ.

(9) Preferably, the light is laser light, and the light scans the main surface of at least one of the diamond layer and the substrate irradiated with the light. When the laser light is used, strong light can be generated by one pulse, and the intensity and the pulse width for example of one pulse can easily be controlled. Moreover, concentration and expansion of the light are easy and the power density can be adjusted. Further, the wavelength of the laser light can be selected, and the wavelength of the light that is difficult to be absorbed by the diamond having higher optical transparency and is easy to be absorbed by the diamond having lower optical transparency or by a defect can be selected.

(10) Preferably, the step of separating the diamond layer from the substrate is performed in a liquid. Accordingly, the impact against the substrate and the diamond layer due to application of the light can be reduced, and generation of cracks and/or breakage in the substrate and the diamond layer can be suppressed.

(11) A diamond according to an aspect of the present invention is a diamond including: a diamond layer; and a light absorbing layer disposed on one surface of the diamond layer and different in optical transparency from the diamond layer, and a surface of the light absorbing layer includes at least one of a diamond crack having a length of not more than 100 μm, a graphite layer having a maximum diameter of not more than 100 μm, and a graphite layer having a length of not less than 200 μm. The light absorbing layer refers to a layer of not less than 5 nm. The graphite layer may not necessarily be a crystalline layer of graphite, and refers broadly to a graphite layer having a peak called G band appearing at around a Raman shift of 1500 to 1600 cm$^{-1}$ given by the Raman spectroscopy. The graphite layer having a length of not less than 200 μm refers to a graphite layer which is formed continuously and in which a straight line of 200 μm can be drawn.

As to the diamond, when the surface of the diamond is planarized, diamond cracks and/or graphite in the surface of the light absorbing layer are easily removed. Therefore, the surface of such a diamond is easy to planarize and the diamond is easy to process for various uses. Moreover, the above diamond can be manufactured by the method of manufacturing a diamond under (1) to (10) described above. In this case, the time for separation from the substrate can be shortened and thus the manufacturing cost is reduced. The light absorbing layer formed for accomplishing the separation in the manufacturing step does not disappear after this manufacturing step, but is partially dispersed in any space other than the separated surfaces when the seed substrate and the diamond layer are separated from each other, and thus remain. The remaining light absorbing layer is present as the light absorbing layer of the diamond in the present embodiment. Moreover, since the strength of diamond bonds is significantly weakened in this light absorbing layer, the light absorbing layer is easy to process. Even when the light absorbing layer remains, it serves as a buffer material when the diamond is joined to another material. In contrast, in the case where the diamond layer is separated by electrochemical etching as done by the conventional method, the main component is diamond and the graphite component has been removed and is therefore absent. Then, in order to remove random scratches which are damaged sites of the separated surface, it is necessary to polish the peripheral diamond, which is difficult. Therefore, the greater the area of the separated surface, the higher the difficulty of removal.

(12) A diamond according to an aspect of the present invention is a diamond including: a diamond layer; and a light absorbing layer disposed on one surface of the diamond layer and different in optical transparency from the diamond layer, and a surface of the light absorbing layer includes at least one of a depression, a substantially circular region exposing the diamond layer, and a substantially circular graphite layer. The depression, the substantially circular region exposing the diamond layer, and the substantially circular graphite layer may each be a row of substantially aligned depressions, circular regions, or circular graphite layers. In the surface of the light absorbing layer, the opening of the depression or the substantially circular region exposing the diamond layer has a diameter of 1 μm to 100 μm and a depth of 25 nm to 10 μm and the substantially circular graphite layer has a diameter of 1 μm to 100 μm and a thickness of 25 nm to 10 μm. In the case where the depressions, the substantially circular regions exposing the diamond layer, or the substantially circular graphite layers are substantially aligned at shorter intervals than the radius of the depression, the circular region, or the graphite layer, or the diameter exceeds 200 μm, the circular shape is difficult to identify, and it may be the shape of an envelope, or a substantially straight line. The depression, the substantially circular region exposing the diamond layer, and the substantially circular graphite layer can be observed for example with a scanning electron microscope, an optical microscope, or differential interference microscope. The depression, the substantially circular region exposing the diamond layer, and the substantially circular graphite layer are each generated due to expansion of the light absorbing layer when the light absorbing layer is caused to absorb light by the method of manufacturing a diamond under (1) to (10) above, for example, and in the form of substantially aligned depressions, circular regions, or circular graphite layers generated as a result of scanning of pulsed light such as laser light. Therefore, while the substantially circular shape is not a perfect circle, it can be clearly identified as a circular shape, rather than triangular or quadrilateral shape. Moreover, while the alignment is not in the form of a straight line, it can be identified as a straight line on the average in consideration of positional fluctuation. As to the diamond, diamond cracks and/or graphite in the surface of the light absorbing layer are easily removed when the surface of the diamond is planarized. Therefore, the surface of such diamond is easy to planarize and the diamond is easy to process for various uses. Moreover, the above diamond can be manufactured by the method of manufacturing a diamond under (1) to (10) above. In this case, the time for separation from the substrate can be shortened and thus the manufacturing cost is reduced.

(13) A diamond according to an aspect of the present invention is a diamond including: a diamond layer; and a light absorbing layer disposed on one surface of the diamond layer and different in optical transparency from the diamond layer, and crystal strain of the light absorbing layer is transferred to a part of the diamond layer. Whether or not crystal strain of the light absorbing layer is transferred is evaluated in the following way. In the light absorbing layer of the present embodiment, many diamond bonds are broken, and therefore the crystallinity of the diamond is significantly deteriorated. In contrast, in the outermost surface of the diamond layer, a minimum periodic structure of the diamond is left so that diamond can be epitaxially grown. The crystallinity of the outermost surface can be evaluated in terms of a single crystal, by the RHEED (Reflection High-Energy Electron Diffraction), or the channeling method of the RBS (Rutherford Backscattering Spectrometry).

The RHEED evaluates the crystallinity relative to a high-pressure synthesized monocrystalline diamond having good crystallinity. The half-width of the intensity at one diffraction spot of the RHEED (the diffraction spot is a vertical line called streak pattern when the surface is flat. In this case, the half width of the intensity is in the direction perpendicular to the line), for the monocrystalline diamond in which the light absorbing layer is formed, is not less than 1.0 times, preferably not less than 1.3 times, and more preferably not less than 1.5 times as large as the value at the same point (same position) of the high-pressure synthesized monocrystalline diamond.

When the channeling method of the RBS is applied, the Xmin (chi minimum) value which is the ratio between an aligned yield (amount of backscatter in a channeling state) in the channeling state (state where respective orientations of the crystal axis and applied ions are exactly the same) and a random yield (amount of backscatter in a state considerably deviated from the channeling state), namely the ratio: (aligned yield)/(random yield), is not more than 5% for excellent single crystal. For the light absorbing layer, it is not less than 6%, preferably not less than 8%, and more preferably not less than 10%, and not more than 98%.

The above-described evaluation method may be used to examine one surface of the diamond layer. Then, whether crystal strain is transferred or not is found. The transferred crystal strain is not dislocation but fluctuation, and is therefore healed with growth of the diamond. Thus, the crystallinity of the outermost surface of the grown diamond is superior to that of the surface to which the crystallinity of the light absorbing layer is transferred. Preferably, the diamond layer maintains the state in which the impurity composition or strain is kept in the grown diamond (growth temperature or less, 1300° C. or less), and agglomeration of impurities or strain in the epitaxial film is not changed by annealing or the like at 1000° C. or more or 1300° C. or more. This is for the reason that preferably no change occurs to the diamond material which is optimized so as not to be apt to chip, for use as a material for a tool, or desirably the amount of warp or the crack reduction ratio optimized for the use as a material for a heat sink or a window is not changed by annealing. Electrochemical separation of an electrically conductive layer is difficult because electric field is not transmitted through the electrically conductive layer, and the separation is only achievable by the method of manufacturing a diamond under (1) to (10) above. The fact that the separated surface through which ions have been implanted is not polished or annealed is useful for maintaining the state where the substrate is not warped.

(14) The diamond preferably includes a layer having a resistivity of not less than $10^{-4}$ Ωcm and less than $10^9$ Ωcm and having a thickness of not less than 1 μm. The resistivity is more preferably not less than $10^{-4}$ Ωcm and less than $10^6$ Ωcm, still more preferably not less than $10^{-4}$ Ωcm and less than $10^3$ Ωcm, and further preferably not less than $10^{-4}$ Ωcm and less than 50 Ω/cm. When the diamond contains impurities to the extent that can give electrical conductivity, the diamond is higher in capability to "bend" relative to the absolutely high-purity material and thus the probability that the diamond cracks is reduced. This diamond is a material which is less prone to chip, and suitable for use for tools.

(15) Preferably, the diamond is a single freestanding body having a thickness of not less than 50 μm and formed of only a layer having a resistivity of not less than $10^{-4}$ Ωcm and less than $10^9$ Ωcm. The resistivity is more preferably not less than $10^{-4}$ Ωcm and less than $10^6$ Ωcm, still more preferably not less than $10^{-4}$ Ωcm and less than $10^3$ Ωcm, and further preferably not less than $10^{-4}$ Ωcm and less than 50 Ωcm. When the diamond contains impurities to the extent that can give electrical conductivity, the diamond is higher in capability to "bend" relative to the absolutely high-purity material and thus the probability that the diamond cracks is reduced. This diamond is a material which is less prone to chip, and suitable for use for tools.

(16) Preferably, the diamond has a vertical displacement per 10 mm of not more than 100 μm, and has a size of a main surface of not less than 12 mm in diameter. The vertical displacement per 10 mm is more preferably not more than 50 μm, not more than 25 μm, and not more than 10 μm. The size in diameter of the main surface is more preferably not less than 50 mm, not less than 75 mm, not less than 100 mm, and not less than 150 mm. A larger value of the vertical displacement per 10 mm means greater warp of the diamond. Moreover, the fact that the size of the main surface is not less than 50 mm in diameter means that a circle having a diameter of not less than 50 mm can be drawn in the main surface. Accordingly, the diamond warps to a lesser extent or does not warp and has the large size, which enables the diamond to be used suitably for various tools.

(17) In the diamond which is the single freestanding body, a difference between an average diamond crystal grain size in one main surface of the diamond and an average diamond crystal grain size in the other main surface of the diamond is preferably not more than 50% of a larger one of the average diamond crystal grain size in the one main surface and the average diamond crystal grain size in the other main surface. The average grain size is an average value of grain sizes obtained through observation of the diamond surface with a scanning electron microscope (SEM), and the observed area has a size, per side, 10 times as large as the grain size in a center (surface barycenter) portion of the diamond. Thus, the front surface is substantially identical to the back surface in terms of the ratio of grain boundaries. Therefore, the front surface and the back surface are substantially identical to each other in terms of the internal stress and the thermal expansion coefficient. Accordingly, there is substantially no difference in the magnitude of warp at different temperatures for use, and there is the effect that the substrate without warp can be fabricated at different temperatures for use.

(18) A diamond composite substrate according to an aspect of the present invention is a diamond composite substrate including: a diamond of any one of above (11) to (17); and a different-kind substrate attached to the diamond, the different-kind substrate being a substrate of a material different from diamond. The diamond composite substrate is applicable to a use in which a material including an ion implantation layer and attached to a tool such as cutting tool bit as it is can be separated along the ion implantation layer. In this case, a shank of the cutting tool bit or the like corresponds to the different-kind substrate.

(19) A diamond joined substrate according to an aspect of the present invention is a diamond joined substrate including: a substrate having a light absorbing layer and including a diamond seed crystal; and a diamond layer disposed on a main surface of the substrate, the light absorbing layer includes different-kind atoms which do not bond with carbon of a diamond lattice, and the different-kind atoms are atoms of at least one kind of element selected from the group consisting of hydrogen, nitrogen, oxygen, helium, neon, and argon. The lower limit of the content of the different-kind atoms in the light absorbing layer is preferably 0.1 ppm, more preferably 1 ppm, and still more preferably 10 ppm. The upper limit thereof is preferably 80%, more preferably 30%, and still more preferably 10%. The thickness of the light absorbing layer is preferably not less than 20 nm and not more than 10 μm, and preferably equal to or more than the thickness 50 μm of the diamond layer. From such a joined substrate, the diamond layer can be separated by means of pulsed light to thereby produce the diamond of the present invention. The diamond joined substrate may directly be used for a tool or heat sink. Even in the state where the diamond serving as a tool or heat sink is joined to a different-kind substrate, the diamond joined to the substrate can be separated along the light absorbing layer.

(20) A tool according to an aspect of the present invention is a tool for which a diamond of any of above (11) to (17) is used. Accordingly, an excellent tool with less chipping or warping can be obtained.

Details of Embodiments of the Invention

Specific examples of a method of manufacturing a diamond, a diamond, a diamond composite substrate, a diamond joined substrate, and a tool in embodiments of the present invention will be described herein after with reference to the drawings. It should be noted that the present invention is not limited to the illustrated examples but defined by claims, and it is intended that the invention encompasses all modifications equivalent in meaning and scope to the claims.

FIRST EMBODIMENT

Method of Manufacturing Diamond

Figure 1C:
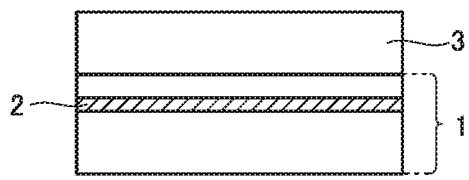
Figure 1:
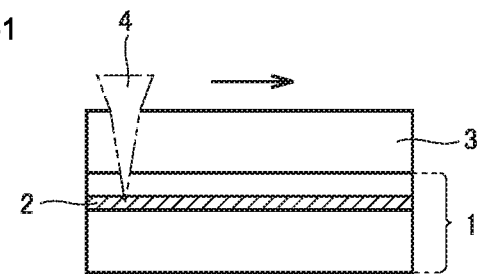
Figure 1:
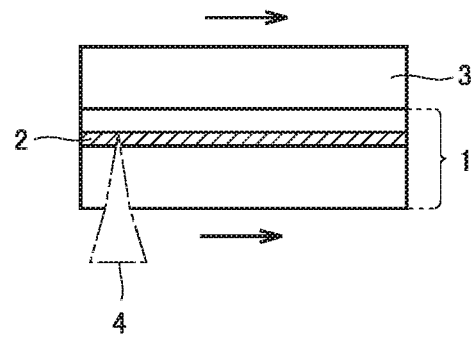
Figure 1E:
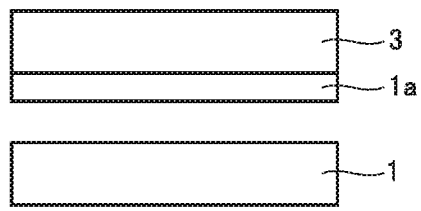

FIG. 1 (A) to FIG. 1 (E) are diagrams schematically illustrating a method of manufacturing a diamond in an embodiment of the present invention. The method of manufacturing a diamond in the embodiment of the present invention is a method of manufacturing a diamond by a vapor phase synthesis method, and includes the steps of: preparing a substrate 1 including a diamond seed crystal (FIG. 1 (A)); forming, at a predetermined depth from a main surface of substrate 1, a light absorbing layer 2 which is lower in optical transparency than substrate 1, by performing ion implantation into substrate 1 (FIG. 1 (B)); growing a diamond layer 3 on the main surface of substrate 1 by the vapor phase synthesis method (FIG. 1(C)); and separating diamond layer 3 from substrate 1 (FIG. 1 (E)) by applying light from a main surface of at least one of diamond layer 3 and substrate 1 (FIG. 1 (D-1), FIG. 1 (D-2)), to allow light absorbing layer 2 to absorb the light and cause light absorbing layer 2 to be broken up. In the case where light is applied from the diamond layer 3 side, the optical transparency of diamond layer 3 is higher than that of light absorbing layer 2. In contrast, in the case where light is applied from the substrate 1 side, the optical transparency of diamond layer 3 is not particularly limited, namely the optical transparency thereof may either be higher or lower than that of light absorbing layer 2. Herein, optical transparency and light absorption respectively refer to optical transparency and light absorption for a wavelength of light used for the separation.

Step of Preparing Substrate

Initially, referring to FIG. 1 (A), substrate 1 including a diamond seed crystal is prepared.

Substrate 1 may be either a monocrystalline diamond or a polycrystalline diamond. Alternatively, substrate 1 may be mosaic single crystals which are bonded in substantially the same direction, or heteroepitaxial diamond grown on a silicon substrate or an iridium substrate. In view of the fact that the monocrystalline diamond is more expensive and serves to enhance the effects of the present embodiment, the monocrystalline diamond is preferred. In any case, a greater size of the substrate is more effective for shortening the time, and therefore preferred, as compared with the method of separation by electrochemical etching. Moreover, in the case of a substrate without warp, although electrochemical etching cannot separate the substrate if the size of the substrate is large, such a substrate can be separated in the present embodiment. Preferably, substrate 1 has high crystallinity. Substrate 1 having high crystallinity enables diamond layer 3 formed on substrate 1 to have high crystallinity as well. Substrate 1 is preferably a monocrystalline diamond manufactured by a high-temperature high-pressure synthesis method. The monocrystalline diamond manufactured by the high-temperature high-pressure synthesis method has a homogeneous crystal structure with high crystallinity. However, the substrate may be a monocrystalline diamond manufactured by the vapor phase synthesis method. Moreover, the substrate may be obtained by processing a diamond obtained by the method of manufacturing a diamond in the present embodiment. Namely, substrate 1 which has once been separated may be used again as substrate 1, or diamond layer 3 which has once been separated may be planarized to be used as a substrate 1, or they may be repeated.

In order to efficiently increase the thickness (in the top-bottom direction in FIG. 1 (C)) of diamond layer 3, the main surface of substrate 1 is preferably (001) plane. Moreover, in order to enhance the homogeneity of the crystal of diamond layer 3, the main surface of substrate 1 may have an off angle to the (001) plane of preferably not less than 0° and not more than 15°, more preferably not less than 1.5° and not more than 10°.

Substrate 1 has a thickness of preferably not less tan 100 μm and not more than 1000 μm, more preferably not less than 300 μm and not more than 800 μm. Thus, in the step of forming a light absorbing layer, light absorbing layer 2 having a predetermined thickness can be formed in substrate 1, at a position of a predetermined depth from the surface of substrate 1. Herein, the thickness of substrate 1 is defined as the thickness measured in the vicinity of the center of the main surface of substrate 1. While the shape of the main surface of substrate 1 is not particularly limited, the main surface may be quadrilateral, polygonal, or circular shape, for example. The main surface of substrate 1 may be flat or in the shape of a concave lens or a convex lens, or may be a surface having protrusions and depressions in rectangular shape, trapezoidal shape, pyramid shape, or the like.

Step of Forming Light Absorbing Layer

Next, referring to FIG. 1 (B), light absorbing layer 2 which is lower in optical transparency than substrate 1 is formed at a predetermined depth from the main surface of substrate 1 by performing ion implantation (in the downward direction indicated by arrows in the drawing) into substrate 1.

The depth, from the surface of the substrate, of light absorbing layer 2 to be formed as well as the thickness of light absorbing layer 2 are adjustable by the kind of ions chiefly used, the implantation energy, and the implantation dose. The design of the ion implantation layer can be predicted through substantially accurate calculation by a Monte Carlo simulation like TRIM.

The implantation energy is preferably not less than 80 keV and not more than 10000 keV, more preferably not less than 180 keV and not more than 350 keV. The implantation dose is preferably not less than $3\times10^{15}$ ions/cm$^2$ and not more than $5\times10^{17}$ ions/cm$^2$, and more preferably not less than $1\times10^{16}$ ions/cm$^2$ and not more than $1\times10^{17}$ ions/cm$^2$. When the implantation energy and the implantation dose each fall in the above-indicated range, the diamond structure in the region where light absorbing layer 2 is formed in substrate 1 can be broken up to form light absorbing layer 2 with reduced optical transparency, while the crystallinity of the main surface of substrate 1 is maintained to the extent that enables epitaxial growth by the vapor phase synthesis method. An excessively low implantation energy or an excessively high implantation dose may cause the crystal structure of diamond in the topmost surface to be broken up. In this case, it may be impossible to synthesize a diamond on the topmost surface after the ion implantation. Even if a diamond can be synthesized thereon, the diamond may be difficult to separate due to the influence of the synthesis atmosphere on the ion implantation layer. An excessively high implantation energy makes the implantation layer too thick, which makes it difficult to obtain flat separated surfaces of the substrate and diamond layer. An excessively low implantation dose makes it difficult to accomplish the separation under the conditions of light irradiation of the present invention.

The light transmittance of light absorbing layer 2 is preferably lower by at least 1%, more preferably lower by at least 5%, and still more preferably lower by at least 20% than the light transmittance of substrate 1. "Lower by at least 1%" means for example that relative to the light transmittance of 65% of substrate 1 without the light absorbing layer, the light transmittance of substrate 1 where light absorbing layer 2 is formed is 64% or less. Herein, light transmittance Ta is a value expressed by the following expression (1) taking into consideration multiple internal reflection.

$$Ta = I_t/I_0 \qquad \text{expression (1)}$$

Further, reflectance Ra taking multiple reflection into consideration and single reflectance R are expressed respectively by the following expressions (2) and (3).

$$Ra = I_r/I_0 \qquad \text{expression (2)}$$

$$R = (n0-nf)^2/(n0+nf)^2 \qquad \text{expression (3)}$$

(in expressions (1) to (3), $I_0$ is the intensity of incident light, $I_t$ is the intensity of emitted light after transmitting through a medium, $I_r$ is the intensity of reflected light after inserting the medium, n0 is the refractive index of air, of is the refractive index of diamond, and x is the thickness of the medium).

The light transmittance can be measured with a common spectrophotometer. The transmittance of the light absorbing layer is a value relative to a layer with higher optical transparency, and derived without subtracting the reflectance, namely the value still includes the reflectance. Therefore, even when the light transmittance for ultraviolet, visible, near infrared radiation is 100%, the transmittance will not exceed 72% because the reflectance is 28% or more. Since the thickness of the light absorbing layer is very small, the absorption coefficient varies to a large extent even when the light transmittance changes by 1%, which is highly effective.

For a wavelength of the light used in the step of separating the diamond layer from the substrate, the absorption coefficient of light absorbing layer 2 is preferably at least five times and more preferably at least 30 times as large as the absorption coefficient of substrate 1. Herein, the light absorption coefficient is a value expressed by the following expression (4) taking multiple internal reflection into consideration.

$$\mu = (\log_e((I_t/I_0)/R-1)))/x \qquad \text{expression (4)}$$

(in expression (4), μ is the light absorption coefficient, $I_0$ is the intensity of incident light, $I_t$ is the intensity of emitted light after transmitting through a medium, $I_r$ is the intensity of reflected light after inserting the medium, R is the single reflectance R represented by expression (3), and x is the thickness of the medium).

When a light source including multiple wavelengths is used, the light transmittance and the absorption coefficient refer to a light transmittance and an absorption coefficient for a wavelength indicating a maximum absorption energy among the wavelengths and the wavelength range included in the light source.

When the relation of the light transmittance or the light absorption coefficient between substrate 1 and light absorbing layer 2 falls in the above-indicated range and light is applied to substrate 1, the light applied to substrate 1 is transmitted through substrate 1 irradiated with the light and absorbed efficiently by light absorbing layer 2. Thus, the time required to break up light absorbing layer 2 can be shortened.

As to the kind of ions to be implanted, ions of any element that enables reduction of the light transmittance of light absorbing layer 2 may be used. For example, ions of all elements that can be implanted such as carbon, boron, nitrogen, oxygen, phosphorus, neon, hydrogen, helium, aluminum, silicon, sulfur, and argon may be used. The coordination number of carbon, boron, nitrogen, and phosphorus in diamond is four. In the case of ion implantation, however, in order for implanted ions to be coordinated so that the coordination number is four, it is necessary to expel other atoms, resulting in a coordination number other than four, which makes the element effective for the present invention. In particular, ions of at least one kind selected from the group consisting of hydrogen ions, hydrogen molecular ions, oxygen ions, oxygen molecular ions, nitrogen ions, nitrogen molecular ions, helium ions, neon ions, and argon ions are preferably used. These ions are easily gasified by light energy. Therefore, in the case of the light absorbing layer including these ions, the ions are gasified to expand when the light absorbing layer is caused to absorb light, which promotes breakage of the light absorbing layer.

Light absorbing layer 2 is at a depth from the main surface of substrate 1 of preferably not less than 0.05 μm and not more than 10 μm, and more preferably not less than 0.1 μm and not more than 1 μm. Thus, the thickness of the layer to be broken up by the applied light is sufficiently small and failure of the separation can be prevented. The main surface of substrate 1 herein refers to the surface through which ion implantation is performed. The depth from the main surface of substrate 1 refers to the distance between the main surface of substrate 1 and the center of light absorbing layer 2 closest to the main surface of substrate 1 (the center is the position of maximum absorption).

Light absorbing layer 2 has a thickness of preferably not less than 20 nm and not more than 10 μm, more preferably not less than 50 nm and not more than 5 μm, and still more preferably not less than 100 nm and not more than 1 μm. Thus, the thickness of the layer to be broken up by the applied light (the layer necessary for the separation) is sufficiently small, and sufficient flatness of the separated surfaces of the diamond layer and the substrate can be ensured.

Light absorbing layer 2 has a maximum peak value of the density of atomic vacancies in a range of preferably not less than 0.01% and not more than 100%, more preferably not less than 0.1% and not more than 100%, and still more preferably not less than 0.1% and not more than 80%, or light absorbing layer 2 has a total atomic concentration of carbon atoms and different-kind atoms that do not bond with carbon forming a diamond lattice, of preferably not less than 1 ppm, more preferably not less than 10 ppm, still more preferably not less than 100 ppm, preferably not more than 30%, more preferably not more than 5%, and still more preferably not more than 1%. When the atoms which do not bond with carbon forming the diamond lattice are carbon atoms, it appears difficult to determine whether such atoms bond with the carbon of the diamond lattice. However, when extra carbon atoms enter the diamond lattice, generally at least 90% of injected carbon atoms cannot bond with the carbon in the lattice. In the case of carbon atoms as well as different-kind atoms other than carbon atoms, mechanical impact applied to the light absorbing layer or a peeling test causes separation at the interface between the light absorbing layer and the diamond layer at a probability of 50% or more (area ratio). This can also be used to determine whether atoms bond with the carbon in the diamond lattice. Since no atom is present at the position of an atomic vacancy, the strength of bonds of atoms around the vacancy is lessened. Therefore, when light absorbing layer 2 absorbs light, the light absorbing layer is broken up from the atomic vacancies as origins of breakup. The density of atomic vacancies falling in the above-indicated range enables breakup of light absorbing layer 2 to be promoted. If the maximum peak value of the density of atomic vacancies is less than 0.01%, there are a less origins of the breakup of the light absorbing layer, resulting in increase of the power and/or time required for the breakup of the light absorbing layer. In such a case, the diamond having high optical transparency is also damaged. When the ion dose is more than $5 \times 10^{17}$ cm$^{-3}$ and the implantation time after the density of atomic vacancies reaches 100% is excessively long, diamond to be formed on the top surface will not be synthesized or the separation fails even when the diamond is synthesized. The value of the density of atomic vacancies is obtained by measurement of the visible or near infrared transmittance. From a calibration curve for the atomic density and the transmittance obtained by a simulation of ion implantation with a constant implantation energy, the atomic density can be calculated. The atomic density is expressed by percentage to an ideal carbon atom density at room temperature. Therefore, when conditions for ion implantation are determined, the density of atomic vacancies can be determined without being measured.

Although the separation can be accomplished by means of light absorbing layer 2 which does not include graphite but includes a collection of atomic vacancies, light absorbing layer 2 may still include a graphite layer. The graphite layer is preferably a layer with many sp2 bonds based on the Raman spectroscopy, rather than graphite with crystalline π bonds. In this case, absorption of light by light absorbing layer 2 causes breakup of the light absorbing layer from an origin, namely the interface of the graphite layer. A graphite layer with many π bonds rather makes the separation difficult, because synthesis of diamond on the top surface through which ions are implanted is difficult. Therefore, the density of vacancies has an upper limit. As to the formation of light absorbing layer 2 by the ion implantation as described above, light absorbing layer 2 can be formed by performing ion implantation again after subsequent formation of diamond layer 3 and polishing of the surface of the diamond layer 3 for making the surface flat or without polishing thereof. Moreover, the above operation may be repeated to form a plurality of light absorbing layers 2.

Step of Growing Diamond Layer

Next, referring to FIG. 1 (C), diamond layer 3 is grown by the vapor phase synthesis method on the main surface of substrate 1. The vapor phase synthesis method is not particularly limited. As the vapor phase synthesis method, hot filament CVD method, microwave plasma CVD method, combustion flame method, DC plasma CVD method, DC arc discharge plasma method, or the like may be used. In particular, the microwave plasma CVD method is preferred since less unintended impurities are mixed. Specifically, for example, substrate 1 is placed in a vacuum chamber, the pressure in the vacuum chamber is set to 2.66 kPa to 53.2 kPa, the temperature in the chamber is increased to 800° C. to 1200° C., then hydrocarbon gas such as methane, hydrogen gas, as well as an additive gas such as inert gas or nitrogen are introduced to epitaxially grow diamond layer 3 on the main surface of substrate 1. While the additive gas is added as required, the additive gas may not be added. The direction in which diamond layer 3 grows is the upward direction in FIG. 1 (C). The plane orientation of the main surface of substrate 1 is transferred to the top surface of diamond layer 3.

The diamond layer grown by the vapor phase synthesis method has higher optical transparency than the light absorbing layer, when light is applied from the main surface of the diamond layer in the step of separating the diamond layer from the substrate. In contrast, when light is applied from the main surface of the substrate, the diamond layer may either be higher or lower in the optical transparency than the light absorbing layer. This is for the following reason. As long as the seed substrate is a diamond higher in optical transparency than the light absorbing layer, light is allowed to pass through the seed substrate to reach the light absorbing layer in the step of separating the diamond layer from the substrate.

As to the relation in light transmittance between diamond layer 3 and light absorbing layer 2, the light transmittance of light absorbing layer 2 is lower than the light transmittance of diamond layer 3 preferably by 1% or more, more preferably by 5% or more, and still more preferably by 20% or more. The light transmittance is herein a value expressed by the above expression (1).

As to the relation in absorption coefficient between diamond layer 3 and light absorbing layer 2 for a wavelength of applied light, the absorption coefficient of light absorbing layer 2 is preferably not less than five times, and more preferably not less than 30 times as large as the absorption coefficient of diamond layer 3. The light absorption coefficient is herein a value expressed by the above expression (4).

When the relation in light transmittance or light absorption coefficient between light absorbing layer 2 and diamond layer 3 falls in the above range, light applied to diamond layer 3 is transmitted through diamond layer 3 and efficiently absorbed by light absorbing layer 2. Thus, the time required for breakup of light absorbing layer 2 can be shortened.

In order to make the light transmittance of diamond layer 3 higher than that of light absorbing layer 2, it is preferable to make the amount of the additive gas sufficiently smaller (0.1% or less) than methane gas, or to set the amount of the additive gas to zero. Alternatively, it is preferable to reduce the methane concentration (5% or less relative to hydrogen gas). Alternatively, it is preferable to increase the substrate temperature (to 1100° C. or more). When the additive gas and the methane concentration are controlled in the above-described manner so that a diamond layer with high crystallinity is formed, the diamond layer having a relatively high light transmittance can be formed even when atomic-level kinks or steps are left on the substrate. The conditions for synthesizing diamond are not limited to the above conditions, and the generally known conditions used by those skilled in the art for synthesizing a transparent diamond may be used without accompanied by disadvantages.

A layer with low optical transparency, specifically a layer lower in optical transparency than high-pressure Type Ib diamond, may be formed enough under common conditions for synthesizing a transparent diamond. In the case where a diamond synthesized under the common synthesis conditions does not have sufficient optical transparency, light for the separation can be applied from the seed substrate side (from the high-pressure Ib diamond side) to separate the substrate and the diamond from each other. It should be noted that the focus of the light is required to be set at the light absorbing layer.

Diamond layer 3 may be either a single crystal or a polycrystal. The single crystal is more expensive and serves to enhance the effects of the present embodiment, and is therefore preferred. Diamond layer 3 may either be electrically conductive or insulative. Since most of the diamonds for industrial use are electrically insulative, diamond layer 3 is preferably electrically insulative. It should be noted that in the case where it is necessary to control the flexibility to "warp" or "bend" by adding impurities, preferably impurities are added to diamond layer 3. In this case, when it is necessary to control the flexibility by adding boron or phosphorus, preferably the electrical conductivity is given at the same time. This is for the reason that when diamond layer is given the electrical conductivity, the magnitude of the conductivity can be used as an index for controlling the amount of impurities to be added. In the case where diamond is used for an electrode for a special use or the like, preferably diamond layer 3 is electrically conductive. In this case, diamond layer 3 hinders electric field to enter light absorbing layer 2, and thus the conventional method based on electrochemical etching is inapplicable and diamond layer 3 cannot be separated from the substrate. An electrically conductive diamond layer can be obtained by adding boron or phosphorus, for replacement sake, into the diamond crystal. In the case where diamond layer 3 with boron or phosphorus added thereto is obtained, the problem can be solved by applying light from the substrate side as described above, depending on the concentration of doping, although diamond layer 3 may be lower in optical transparency than light absorbing layer 2.

For diamond layer 3 to be freestanding, the thickness of diamond layer 3 is preferably not less than 50 μm, and more preferably not less than 100 μm. For diamond layer 3 to be less apt to break up, the thickness of diamond layer 3 is preferably not less than 300 μm, and more preferably not less than 500 μm. When a substrate of a different kind is to be joined onto diamond layer 3, the thickness of diamond layer 3 is preferably not less than 1 μm, and more preferably not less than 5 μm. Even in the presence of light scattering at the joint portion or reflection of light due to the electrical conductivity, or inadequate thermal durability, the present embodiment can still separate diamond layer 3 from substrate 1 without damaging substrate 1 or diamond layer 3, since light can be applied from the substrate 1 side.

Step of Separating Diamond Layer from Substrate

Next, referring to FIG. 1 (D-1) and FIG. 1 (D-2), light 4 is applied from the main surface of at least one of diamond layer 3 and substrate 1. Referring to FIG. 1 (E), light absorbing layer 2 is caused to absorb light 4 and accordingly light absorbing layer 2 is broken up to thereby separate diamond layer 3 from substrate 1. Since light absorbing layer 2 is formed by ion implantation, light absorbing layer 2 includes atomic vacancies or graphite. The graphite is not crystalline but a layer containing a large amount of sp2 under the Raman spectroscopy. Namely, graphite is not such a material which is easily separated at a π bond. Absorption of light 4 by light absorbing layer 2 causes the temperature of light absorbing layer 2 to increase, which causes expansion of different-kind atoms in the diamond or atoms (including carbon atoms) which do not bond with the carbon of the diamond lattice, and thereby causes breakup of light absorbing layer 2 from the weak sites, namely atomic vacancies, or the interface of the graphite. At this time, it can be forced to expand without affecting diamond layer 3. Light absorbing layer 2 is formed by ion implantation through a smooth or flat surface formed in advance. Therefore, the interface between substrate 1 and diamond layer 3 is less uneven. Accordingly, respective separated surfaces of substrate 1 and diamond layer 3 after light absorbing layer 2 absorbs the light to thereby break up have a small surface roughness. The separated surfaces have a surface roughness on the order of the thickness of the light absorbing layer, and therefore, the surface roughness can be smaller than 10 μm and even smaller than 1 μm.

Light 4 may be applied from the main surface of diamond layer 3 as shown in FIG. 1 (D-1). As shown in FIG. 1 (D-2), light 4 may also be applied from a main surface of substrate 1 that is opposite to the main surface thereof on which diamond layer 3 is formed. The outermost layer irradiated with the light may be a surface which is rough to some extent. This is the same as the principle that information in a CD can be extracted even when the surface of the CD is fogged. Thus, even when the outermost surface irradiated with the light is rough, the light can be caused to be absorbed appropriately by the light absorbing layer.

As the light source of the applied light, pulse laser, CW laser (Continuous Wave Laser), flash lamp, pulsed lamp, or the like may be used. In particular, when a light source emitting pulsed light such as pulsed laser, flash lamp, pulsed lamp or the like is used, application of the light can be stopped before increase of the temperature of the whole diamond and application of the light can be restarted after the diamond is cooled down, and thus the temperature of only the light absorbing layer can be increased. Use of a light source emitting pulsed light is therefore preferred. The pulsed lamp refers to a lamp which may be of continuous irradiation type but still emit substantially pulsed light by using a shield plate to physically block the light or change the light path.

In the case where pulsed light is used as the light emitted from the light source, the irradiation fluence per pulse on the main surface of at least one of diamond layer 3 and substrate 1 irradiated with the light is preferably not less than 0.001 $J/mm^2$ and not more than 800 $J/mm^2$, more preferably not less than 0.01 $J/mm^2$ and not more than 800 $J/mm^2$, still more preferably not less than 0.1 $J/mm^2$ and not more than 800 $J/mm^2$, and further preferably not less than 0.1 $J/mm^2$ and not more than 10 $J/mm^2$. The pulse width is preferably not less than 0.01 psec and not more than 10 msec, more preferably not less than 0.1 nsec and not more than 10 msec, still more preferably not less than 0.1 nsec and not more than 1 msec, and further preferably not less than 1 nsec and not more than 1 msec. The pulse interval is preferably not less than 1 nsec, more preferably not less than 1 μsec, more preferably not less than 10 μsec, preferably not more than 1 sec, more preferably not more than 10 msec, and still more preferably not more than 1 msec. The repetition frequency is preferably not less than 1 Hz, more preferably not less than 100 Hz, still more preferably not less than 1 kHz, preferably not more than 1000 MHz, more preferably not more than 1000 kHz, and further preferably not more than 100 kHz. The ratio of the pulse interval to the pulse width, namely the ratio: interval/width, is preferably 10 to $10^9$, more preferably 10 to $10^6$, and still more preferably 10 to 1000. Accordingly, the light can cause increase of the temperature of only the light absorbing layer without causing increase of the temperature of the diamond layer and the substrate. Therefore, without breakup of respective surfaces of the diamond layer and the substrate and without generation of cracks in the substrate and the diamond layer, only the light absorbing layer can be broken up. If the irradiation fluence per pulse of the pulsed light is less than 0.1 $J/mm^2$, the number of pulses required to break up the light absorbing layer is larger, or the pulsed light cannot break up the light absorbing layer. In contrast, if the irradiation fluence per pulse of the pulsed light is more than 800 $J/mm^2$, the surface of the substrate or the diamond layer or the internal crystal structure can be damaged. If the pulse width is less than 0.1 nsec, the energy is at the level of breaking the diamond bond, which therefore affects diamond layer 3 to roughen the surface or break the surface. In order to eliminate these drawbacks, it is required to set the power of the applied light to a low power so as not to break the bonds of diamond, and to reduce the pulse interval so as to increase the energy applied to the gas and prevent increase of the temperature of the whole substrate. By devising a scheme such as combining light having a shorter pulse interval and light having a longer pulse interval, or shifting the focus out of the light absorbing layer, or applying light in a liquid, for example, the separated surfaces of the diamond layer and the substrate can be prevented from being roughened or broken. If the pulse width is less than 0.01 psec, diamond bonds are broken, which makes it difficult to prevent the surface from being roughened or broken.

The pulse width of the pulsed light is preferably not less than 0.01 psec and not more than 10 msec, more preferably not less than 0.1 nsec and not more than 10 msec, still more preferably not less than 0.1 nsec and not more than 1 msec, and further preferably not less than 1 nsec and not more than 1 msec. If the pulse width is less than 0.01 psec, bonds of the diamond are directly broken and problems such as cracks arise. A pulse width of not less than 0.01 psec and less than 0.1 nsec is effective since gasification of carbon, boron, and phosphorus which do not bond with the carbon of the lattice is facilitated. A pulse width of not less than 0.1 nsec is effective since gasification of hydrogen, oxygen, nitrogen, and inert element is facilitated. In contrast, a pulse width of more than 10 msec affects not only the light absorbing layer but also the temperature increase of the whole substrate.

The light to be applied is preferably laser light. Use of the laser light enables the effect that the pulse width and intensity can readily be changed and the effect that the wavelength appropriate for the absorption can be selected. As the laser, depending on the absorption wavelength of the light absorbing layer, a solid laser, a liquid laser, a gas laser, or the like may be used. Specifically, glass laser, YAG laser (YAG: Yttrium Aluminum Garnet), YLF laser (YLF: Yttrium Lithium Fluoride), $CO_2$ laser, excimer laser, Yb-doped fiber laser, or the like may be used. Moreover, a wavelength such as wavelengths twice or three times as long as them may be obtained through SHG (Second Harmonic Generation) or the like and used.

The wavelength of the laser light can be selected appropriately depending on the absorption wavelength of the light absorbing layer. For example, the laser light wavelength is preferably not less than 250 nm and not more than 400 nm, and more preferably not less than 450 nm and not more than 550 nm. Further, the wavelength is more preferably not less than 1 μm and not more than 2 μm. Namely, a longer wavelength of the laser light is preferred since the difference in absorption coefficient between the formed light absorbing layer and the light transmitting layer is larger.

Preferably, the laser light scans the main surface of diamond layer 3 or substrate 1. The scan speed is determined by the pulse interval (frequency) and the size of the light (laser beam size). The operation rate is preferably not less than twice as high as (pulse frequency)×(beam size) and not more than 30 times as high as (pulse frequency)×(beam size), and more preferably not less than five times and not more than 20 times. Accordingly, the flatness of the processed surface can be increased and the separation can be done efficiently within a short time with no waste.

The step of separating diamond layer 3 from substrate 1 is preferably performed in a liquid. Accordingly, the impact of the applied light on substrate 1 and diamond layer 3 can be reduced and therefore generation of cracks in substrate 1 and diamond layer 3 can be suppressed. The liquid is not particularly limited as long as the liquid can reduce the impact of the laser light. For example, pure water, various aqueous solutions, various oils, and the like may be used as the liquid.

The step of separating diamond layer 3 from substrate 1 is preferably performed while lowering the ambient temperature. Accordingly, thermal expansion of substrate 1 or diamond layer 3 due to the applied light can be reduced and thus generation of cracks in substrate 1 or diamond layer 3 can be suppressed. The temperature can be lowered for example by introducing a refrigerant atmosphere, or using cooled pure water, various aqueous solutions, various oils, and the like.

Respective separated surfaces of separated substrate 1 and diamond layer 3 have a small surface roughness. In the case where the separated diamond layer 3 is used as a tool, it may be necessary to make the surface flat. Since the separated surface of diamond layer 3 has a small surface roughness, diamond layer 3 can easily be processed into a tool. Moreover, in order to use the separated substrate 1 as a substrate again for epitaxial growth, it is necessary to make the surface flat. Since substrate 1 has a small surface roughness of the separated surface, substrate 1 can easily be processed into a substrate. Eventually, without re-processing of the substrate, ion implantation can be performed through the same process and then the separation can be accomplished with a laser after CVD epitaxial growth.

The separated substrate 1 and diamond layer 3 have a surface roughness (Ra) of preferably not more than 3 μm, more preferably less than 0.3 μm. Accordingly, the surface can easily be processed into a flat surface. The surface roughness (Ra) herein refers to arithmetic mean roughness determined in the following way. From a roughness curve, a portion of the roughness curve with a reference length in the direction of an average line of the roughness is extracted. The X axis is defined as the direction of the average line of the extracted portion, and the Y axis is defined as the direction of the vertical magnification. Then, the roughness curve is represented by $y=f(x)$. Then, the value determined by the following expression (3) and expressed in micrometer (μm) is used as the surface roughness Ra.

$$Ra = \frac{1}{\ell} \int_0^\ell |f(x)| dx$$

To the separated surface of separated diamond layer 3, a part 1a of the substrate may adhere. In this case, the surface roughness of the separated surface of diamond layer 3 refers to the surface roughness of the separated surface including a part 1a of the substrate.

Substrate 1 can be planarized by common mechanical polishing, and Ra of 0.1 nm can be obtained. When ions are implanted through the surface of the substrate to form the light absorbing layer, the surface of the light absorbing layer has Ra equivalent to that of substrate 1. The separation by the light causes the flatness to decrease. However, the flatness can be improved by devising a scheme of decreasing the thickness of the light absorbing layer to be separated, lowering the light scan rate, or using minimum possible power, for example.

As to the separation along light absorbing layer 2 in the present embodiment, even when a plurality of light absorbing layers are present, the focus of irradiation may be placed successively from the uppermost light absorbing layer and accordingly light may be applied to thereby separate the layers one by one. Moreover, the surface of light absorbing layer 2 may not be completely flat. Namely, the amount of carbon-carbon bonds in substrate 1 or diamond layer 3 is significantly larger than that in light absorbing layer 2. Therefore, even when the focus of irradiation is somewhat deviated from light absorbing layer 2, the separation is properly accomplished as long as the light power threshold value is set between light absorbing layer 2 and substrate 1 or between light absorbing layer 2 and diamond layer 3.

SECOND EMBODIMENT

Figure 2A:
FIG. 2 (A) to FIG. 2 (E) are diagrams schematically illustrating a method of manufacturing a diamond according to an aspect of the present invention.
Figure 2B:
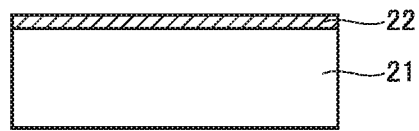
Figure 2C:
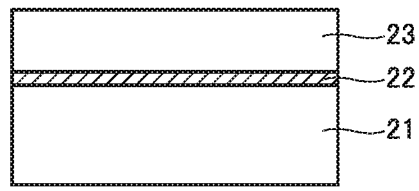
Figure 2:
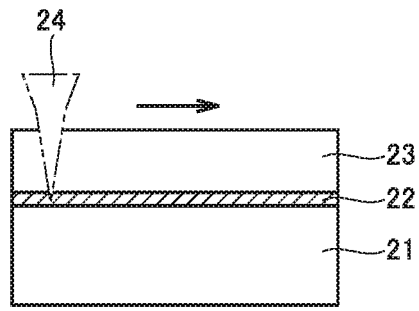
Figure 2:
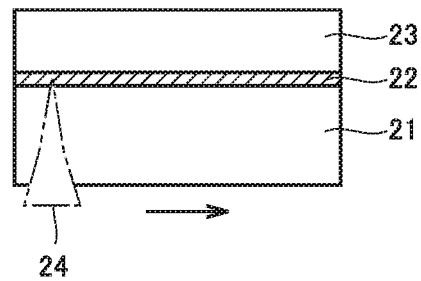
Figure 2E:
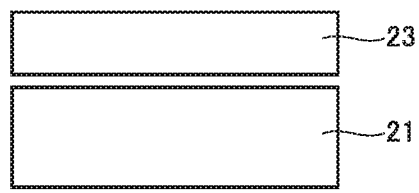

FIG. 2 (A) to FIG. 2 (E) are diagrams schematically illustrating a method of manufacturing a diamond in an embodiment of the present invention. The method of manufacturing a diamond in the embodiment of the present invention is a method of manufacturing a diamond by a vapor phase synthesis method, and includes the steps of: preparing a substrate 21 including a diamond seed crystal (FIG. 2 (A)); forming a light absorbing layer 22 on a main surface of substrate 21 by the vapor phase synthesis method, the light absorbing layer being lower in optical transparency than substrate 21, having a maximum peak value of a density of atomic vacancies in a range of not less than 0.01% and not more than 20% or having a total atomic concentration of not less than 0.1 ppm and not more than 10% of carbon atoms and different-kind atoms which do not bond with carbon forming a diamond lattice (FIG. 2 (B)); growing a diamond layer 23 on a main surface of light absorbing layer 22 by the vapor phase synthesis method (FIG. 2 (C)); and separating diamond layer 23 from substrate 21 by applying light from a main surface of at least one of diamond layer 23 and substrate 21 to allow light absorbing layer 22 to absorb the light and cause the light absorbing layer to be broken up (FIG. 2 (E)). The diamond layer grown by the vapor phase synthesis method is higher in optical transparency than the light absorbing layer when light is applied from the main surface of the diamond layer in the step of separating the diamond layer from the substrate. In contrast, when the light is applied from the main surface of the substrate, the diamond layer may either be higher or lower in optical transparency than the light absorbing layer. This is for the following reason. If the seed substrate is a diamond with a higher optical transparency than the light absorbing layer, the light can be applied to pass from the seed substrate side to reach the light absorbing layer in the step of separating the diamond layer from the substrate.

The essence of this aspect is formation of weak diamond bonds in advance during synthesis of diamond, rather than breakage of diamond bonds by application of light such as laser light or rather than formation of a reformed layer or a transformed layer in the diamond by application of light such as laser light. For conventional diamond growth, strong diamond bonds are produced for each layer. For the light absorbing layer of this aspect, the diamond is grown in which atomic vacancies are contained and carbon-carbon bonds are partially broken. After the layer is formed to a certain extent, a layer is formed again containing only diamond bonds with less atomic vacancies. After this, light such as laser light is applied to give energy to the light absorbing layer and thereby break only the weak carbon-carbon bonds. At this time, it is more effective to synthesize the light absorbing layer to contain atoms other than carbon atoms, such as helium atoms, argon atoms, hydrogen atoms, and nitrogen atoms, for example. Then, the atoms other than carbon atoms are located in the vacancies or interlattice sites, which facilitates conversion of the energy of the applied light into the energy for expansion of these atoms. This method can also separate the substrate and the diamond layer grown on the substrate by the light energy which is significantly smaller as compared with the conventional method which breaks the bonds by only the laser light. It has conventionally been difficult to grow a diamond in which carbon-carbon bonds are partially broken to the extent that allows the separation with small energy such as laser light. Regarding this aspect, the light absorbing layer of a diamond in which bonds are partially broken and atomic vacancies are also contained is grown, and therefore, even by the light with smaller energy, the substrate can be separated from the diamond layer grown on the substrate.

The method of manufacturing a diamond in the second embodiment differs from the method of manufacturing a diamond in the first embodiment in terms of the step of forming a light absorbing layer and the step of growing a diamond layer, while the step of preparing a substrate and the step of separating the diamond layer from the substrate are common to these methods. Therefore, in connection with the second embodiment, a description will be given of the step of forming a light absorbing layer and the step of growing a diamond layer, and the description of other steps will not be repeated.

Step of Forming Light Absorbing Layer

Referring to FIG. 2 (B), light absorbing layer 22 is formed on substrate 21 by the vapor phase synthesis method. The vapor phase synthesis method is performed under conditions that allow light absorbing layer 22 to have a maximum peak value of the density of atomic vacancies in a range of not less than 0.01% and not more than 20% or have a total atomic concentration of not less than 0.1 ppm and not more than 10% of carbon atoms and different-kind atoms that do not bond with carbon forming a diamond lattice. Alternatively, the vapor phase synthesis method is performed under conditions that allow light absorbing layer 22 to contain hydrogen atoms or inert atoms in a range of not less than 8 ppm and not more than 80000 ppm, to have a maximum peak value of the density of atomic vacancies in a range of not less than 0.01% and not more than 100%, and to be lower in optical transparency than substrate 21. The density of atomic vacancies is preferably not less than 0.1% and preferably not more than 10%. The total atomic concentration of carbon atoms and different-kind atoms that do not bond with carbon forming the diamond lattice is preferably not less than 1 ppm, more preferably not less than 10 ppm, and preferably not more than 5%, more preferably not more than 1%. For example, in a gas introduced into a chamber in which the vapor phase synthesis is performed, the concentration of methane gas relative to hydrogen gas is not less than 10%, preferably not less than 20%. Then, hydrogen atoms or inert atoms in light absorbing layer 22 can be not less than 8 ppm and not more than 80000 ppm, and the maximum peak value of the density of atomic vacancies can fall in a range of not less than 0.01% and not more than 100%. At this time, the light absorbing layer is grown on the substrate in which the direction of the off angle of the substrate conforms to the direction of periodic polishing scratches having an Ra of not less than 5 nm, so that macro-step bunching (steps five times or more as large steps at the atomic level) is formed on the substrate Moreover, preferably the vapor phase synthesis is performed under the above described conditions as well as the condition that allows light absorbing layer 22 to contain impurities of at least any of hydrogen atoms, nitrogen atoms, silicon atoms, neon atoms, or phosphorus atoms. Accordingly, the impurities are incorporated into sites other than the sites for replacement with carbon in the diamond, and thus the density of atomic vacancies can be increased and the optical transparency of the light absorbing layer 22 can be reduced.

On the surface of light absorbing layer 22, preferably the number of artificially generated steps or steps of step bunching is not less than 100 steps/mm$^2$ and not more than 1000000 steps/mm$^2$. Accordingly, incorporation of elements in the synthesis atmosphere is facilitated and incorporation of atomic vacancies is also facilitated to allow the above-described value to be satisfied. The steps can be artificially formed by only forming grooves of not less than 5 μm in width in a single crystal having an off angle of 2° or more, and the number of the steps is equal to the number of the grooves. The steps or step bunching can be observed through a scanning tunneling microscope (STM), atomic force microscope (AFM), scanning electron microscope (SEM), optical microscope, or the like.

Light absorbing layer 22 may include a graphite phase together with a diamond phase. The content of the diamond phase in light absorbing layer 22 is preferably not less than 50 vol %. A content of the diamond phase of not less than 50 vol % allows the crystallinity of light absorbing layer 22 to be maintained. Thus, diamond layer 23 with excellent crystallinity can be formed on the surface of light absorbing layer 22.

Step of Growing Diamond Layer

Referring next to FIG. 2 (C), diamond layer 23 which is higher in optical transparency than light absorbing layer 22 is grown by the vapor phase synthesis method on a main surface of light absorbing layer 22. As conditions for the growth, similar conditions to those of the first embodiment can be used.

THIRD EMBODIMENT

A diamond in an embodiment of the present invention is a diamond including: a diamond layer; and a light absorbing layer disposed on one surface of the diamond layer and different in optical transparency from the diamond layer, and a surface of the light absorbing layer includes at least one of a diamond crack having a length of not more than 100 μm, a graphite layer having a maximum diameter of not more than 100 μm, and a graphite layer having a length of not less than 200 μm. The light absorbing layer refers to a layer of not less than 5 nm. The graphite layer may not necessarily be a crystalline layer of graphite, and refers broadly to a graphite layer having a peak called G band appearing at around a Raman shift of 1500 to 1600 cm$^{-1}$ given by the Raman spectroscopy. The graphite layer having a length of not less than 200 μm refers to a graphite layer which is formed continuously and in which a straight line of 200 μm can be drawn. As to the diamond, when the surface of the diamond is planarized, diamond cracks and/or graphite in the surface of the light absorbing layer are easily removed, since the light absorbing layer is a layer in which the strength of diamond bonds is weak. Therefore, the surface of such a diamond is easy to planarize and the diamond is easy to process for various uses. Moreover, the above diamond can be manufactured by the methods of manufacturing a diamond in the first and second embodiments. In this case, the time for separation from the substrate can be shortened and thus the manufacturing cost is reduced. The light absorbing layer with weak bonds may be left, since it serves as a buffer material when the diamond is joined to another material, and is therefore effective.

Moreover, a diamond according to an aspect of the present invention includes: a diamond layer; and a light absorbing layer disposed on one surface of the diamond layer and different in optical transparency from the diamond layer. A surface of the light absorbing layer includes at least one of a depression, a substantially circular region exposing the diamond layer, and a substantially circular graphite layer. The depression, the substantially circular region exposing the diamond layer, and the substantially circular graphite layer are each generated due to expansion of the light absorbing layer when the light absorbing layer is caused to absorb light, and in the form of a row of depressions, circular regions, or circular graphite layers generated as a result of scanning of pulsed light such as laser light. It should be noted that all pulses generate such a characteristic shape, and only a part of the pulses meeting certain conditions generates it. As to the diamond, when the surface of the diamond is planarized, diamond cracks and/or graphite in the surface of the light absorbing layer are easily removed, as described above. This is due to the light absorbing layer as also described above. Therefore, the surface of such a diamond is easy to planarize and the diamond is easy to process for various uses. Moreover, the diamond can be manufactured by the methods of manufacturing a diamond in the first and second embodiments. In this case, the time for separation from the substrate can be shortened and thus the manufacturing cost is reduced. Moreover, as described above, the light absorbing layer with weak bonds may be left, since it serves as a buffer material when the diamond is joined to another material. The characteristic shape exhibits the effect of increasing the joint strength.

A diamond according to an aspect of the present invention is a diamond including: a diamond layer; and a light absorbing layer disposed on one surface of the diamond layer and different in optical transparency from the diamond layer, and crystal strain of the light absorbing layer is transferred to a part of the diamond layer. In the light absorbing layer, diamond bonds are broken and thus the strength of bonds is weakened, resulting in deterioration of the crystallinity. It should be noted it is important that the outermost surface maintains the regularity of single crystal, since a single crystal is required to be grown epitaxially on the outermost layer. The crystal strain is not a crystal defect such as dislocation but corresponds to fluctuation of the crystal axis or crystal plane. With crystal growth continued on the outermost surface, the relevant strain is healed. Besides the strain, preferably the epitaxially grown diamond layer maintains the state in which the impurity composition or strain (including dislocation and optical strain) in the diamond is kept controlled (the growth temperature or less, 1300° C. or less for example), and agglomeration of impurities or strain in the epitaxial film is not changed by annealing or the like at not less than 1000° C. or not less than 1300° C. This is for the reason that preferably no change occurs to the diamond material which is optimized so as not to be apt to chip, for use as a material for a tool, or that desirably the amount of warp or the crack reduction ratio optimized for use as a material for a heat sink or a window is not changed by annealing. It should be noted that the surface of the diamond according to an aspect of the present invention does not have randomly curved scratches having a depth of 1 μm or more which are likely to be generated due to electrochemical etching and which are likely to appear when different-kind elements are contained in the diamond.

The diamond preferably includes a layer having a resistivity of not less than $10^{-4}$ Ωcm and less than $10^9$ Ωcm and having a thickness of not less than 1 μm. The resistivity is more preferably not less than $10^{-4}$ Ωcm and less than $10^6$ Ωcm, still more preferably not less than $10^{-4}$ Ωcm and less than $10^3$ Ωcm, and further preferably not less than $10^{-4}$ Ωcm and less than 50 Ωcm. When the diamond contains impurities to the extent that can give electrical conductivity, the diamond is higher in capability to "bend" relative to the absolutely high-purity material and thus the probability that the diamond cracks is reduced. This diamond is a material which is less prone to chip, and suitable for use for tools.

Preferably the diamond is a single freestanding body having a thickness of not less than 50 μm and formed of only a layer having a resistivity of not less than $10^{-4}$ Ωcm and less than $10^9$ Ωcm. The resistivity is more preferably not less than $10^{-4}$ Ωcm and less than $10^6$ Ωcm, still more preferably not less than $10^{-4}$ Ωcm and less than $10^3$ Ωcm, and further preferably not less than $10^{-4}$ Ωcm and less than 50 Ωcm. When the diamond contains impurities to the extent that can give electrical conductivity, the diamond is higher in capability to "bend" relative to the absolutely high-purity material and thus the probability that the diamond cracks is reduced. This diamond is a material which is less prone to chip, and suitable for use for tools.

Preferably, the diamond has a vertical displacement per 10 mm of not more than 100 μm, and has a size of a main surface of not less than 12 mm in diameter. The vertical displacement per 10 mm is more preferably not more than 50 μm, not more than 25 μm, and not more than 10 μm. The size in diameter of the main surface is more preferably not less than 50 mm, not less than 75 mm, not less than 100 mm, and not less than 150 mm. Accordingly, the diamond warps to a lesser extent or does not warp and has the large size, which enables the diamond to be used suitably for various tools.

When a polycrystalline diamond is synthesized on a different-kind substrate by the vapor phase synthesis method and then the different-kind substrate is removed, the grain size of the front side of the diamond is always at least 10 times larger or smaller than the grain size of the back side thereof. If polishing is performed so that the grain size of the front side of the diamond is identical to the grain size of the back side thereof, the diamond is warped by 200 μm/10 mm or more. Regarding the diamond in the present embodiment, the warp of the diamond falls in the above-indicated range and thus this problem can be solved. The warp of 200 μm/10 mm herein refers to a vertical displacement of 200 μm at a point located 10 mm inward away from the point of surface barycenter, and the vertical displacement is the displacement from the point of barycenter. Namely, the vertical displacement per 10 mm is 200 μm. When the warp is large, the vertical displacement is not strictly proportional to the inward distance. However, when angle θ expressed by Tan θ=(vertical displacement)/(inward distance) is several degrees or less, it may be regarded as substantially proportional in terms of simple mathematics (namely, for a substrate smaller than 10 mm in size, it corresponds to 20 µm/1 mm or the like).

Warp and crack are more likely to occur to a diamond of a greater size. In the present embodiment, however, even when the size is large, the separation is accomplished in a short time at a low temperature (room temperature) without accompanied by influence of thermal expansion and with irradiation with low power light. Moreover, a diamond layer of 12 mmϕ or more having less warp is difficult to electrochemically separate, and a diamond layer with a diameter of 25 mm or more cannot be separated, since liquid does not enter narrow gaps and thus electrochemical etching cannot be performed. As to a preferred range of the warp, a vertical displacement per 10 mm is preferably 100 µm or less. The substrate size is preferably 12 mm or more in diameter. Further, a diameter of 25 mm or more, a diameter of 50 mm or more, a diameter of 75 mm or more, a diameter of 100 mm or more, and a diameter of 150 mm or more are still more preferred. A substrate which is not thermally influenced, has a large size, and has less warp cannot be separated by other means, and such a substrate can only be separated by the method herein disclosed.

In the diamond which is the single freestanding body, a difference between an average diamond crystal grain size in one main surface of the diamond and an average diamond crystal grain size in the other main surface of the diamond is preferably not more than 50% of a larger one of the average diamond crystal grain size in the one main surface and the average diamond crystal grain size in the other main surface. "Not more than 50%" means (larger average grain size)×0.5≤(smaller average grain size). The average grain size is an average value of grain sizes obtained through observation of the diamond surface with a scanning electron microscope (SEM), and the observed area has a size, per side, 10 times as large as the grain size in a center (surface barycenter) portion of the diamond. Thus, the front surface is substantially identical to the back surface in terms of the ratio of grain boundaries. Therefore, the front surface and the back surface are substantially identical to each other in terms of the internal stress and the thermal expansion coefficient. Accordingly, there is substantially no difference in the magnitude of warp at different temperatures for use, and there is the effect that the substrate without warp can be fabricated at different temperatures for use. Moreover, the average grain size may be not less than 30 µm, preferably not less than 100 µm. This is for the reason that when there are many grain boundaries in an expanded portion of the light absorbing layer, the strength is decreased.

FOURTH EMBODIMENT

A diamond composite substrate in an embodiment of the present invention is a diamond composite substrate including: a diamond in the third embodiment; and a different-kind substrate attached to the diamond, the different-kind substrate being a substrate of a material different from diamond. The diamond composite substrate is applicable to a use in which a material including an ion implantation layer and attached to a tool such as cutting tool bit as it is can be separated along the ion implantation layer. In this case, a shank of the cutting tool bit or the like corresponds to the different-kind substrate.

The different-kind substrate is preferably an electrically conductive substrate having a resistivity of less than $10^9$ Ωcm. The resistivity is an average resistivity calculated from a DC current value when a DC voltage of 100 V is applied to a plate off 100 µm in thickness at room temperature. When a positive number and a negative number differ from each other, the number with a greater absolute value is the resistivity. The method of manufacturing a diamond in an embodiment can separate the diamond layer at room temperature. Therefore, when layers attached to each other differ in thermal expansion coefficient, or a joint member is necessary for attachment of the layers to each other, the different-kind substrate to be combined can be selected without being influenced by the melting point of the joint member. Therefore, for the method of separation in an embodiment in which impact somewhat occurs, the presence of the electrically conductive substrate is preferred.

FIFTH EMBODIMENT

A diamond joined substrate in an embodiment of the present invention is a diamond joined substrate including: a substrate having a light absorbing layer and including a diamond seed crystal; and a diamond layer disposed on a main surface of the substrate, and the light absorbing layer includes different-kind atoms which do not bond with carbon of a diamond lattice, and the different-kind atoms are atoms of at least one kind of element selected from the group consisting of hydrogen, nitrogen, oxygen, helium, neon, and argon. From such a joined substrate, the diamond layer can be separated by means of pulsed light to thereby produce the diamond of the present invention. The diamond joined substrate may directly be used for a tool or heat sink. Even in the state where the diamond serving as a tool or heat sink is joined to a different-kind substrate, the diamond joined to the substrate can be separated along the light absorbing layer.

SIXTH EMBODIMENT

A tool in an embodiment of the present invention is a tool for which a diamond in the third embodiment is used. Accordingly, the excellent tool with less chipping or warp can be obtained. Regarding the diamond, the time taken for separation from the substrate is shortened, and thus the manufacturing cost is reduced.

The tool is specifically a cutting tool such as diamond tool bit, drill, end mill, indexable insert for drill, indexable insert for end mill, indexable insert for milling, indexable insert for cutting, metal saw, gear-cutting tool, reamer, tap, and the like. The tool is not limited to the cutting tool, and may be grinding tool, abrasion-resistant tool, part, or the like. The grinding tool may be dresser or the like. The abrasion-resistant tool and part may be die, scriber, water or powder jet nozzle, or guide such as wire.

EXAMPLE 1

In the following, the embodiments of the present invention will be described in further detail with reference to Examples. The embodiments of the present invention, however, are not limited to them.

Sample 1

Preparation of Substrate

Initially, a Type IIa monocrystalline diamond substrate produced by high-temperature high-pressure synthesis to have a size of 6 mm×6 mm and a thickness of 1 mm was prepared. After mechanical polishing of the surface of the substrate, reactive ion etching was performed to etch the surface of the substrate by a thickness of 1 μm to 2 μm.

Formation of Light Absorbing Layer

Next, hydrogen ions were implanted from the main surface of the substrate to form a light absorbing layer. The implantation energy was 75 keV and the implantation dose was $1×10^{17}$ ions/cm$^2$. The depth of the light absorbing layer, namely the depth from the main surface of the substrate, was about 0.34 μm, and the thickness of the light absorbing layer was about 0.06 μm. The fact that the light transmittance of the light absorbing layer was lower than the light transmittance of the substrate was visually confirmed.

The density of atomic vacancies in the light absorbing layer was measured at the transmittance for a wavelength of 800 nm, and the estimated density was 6%. The density may not be actually measured, and the density can be determined through a simulation by determining conditions such as the material to be implanted by ion implantation, the implantation energy, the implanted atoms, and the dose, for example.

Formation of Diamond Layer

Next, the substrate in which the light absorbing layer was formed was placed in a vacuum chamber of a microwave plasma CVD apparatus, so that a main surface of the light absorbing layer side was exposed. Then, the substrate was heated to a temperature of 800° C., the pressure in the vacuum chamber was adjusted to 13.3 kPa, and thereafter hydrogen gas, methane gas, and nitrogen gas were introduced into the vacuum chamber to perform microwave plasma CVD method and thereby form a monocrystalline diamond layer having a thickness of 500 μm on the substrate. The ratio (vol %) between the gases at this time was: hydrogen gas:methane gas:nitrogen gas=92:8:0.005.

The light transmittance (T1) of the substrate, the light transmittance (T2) of the light absorbing layer, and the light transmittance (T3) of the diamond layer were measured with a common ultraviolet-visible-near-infrared spectrophotometer. The ratio (T2/T1) between the light transmittance (T1) of the substrate and the light transmittance (T2) of the light absorbing layer for light having a wavelength of 800 nm was 70%. The ratio (T2/T3) between the light transmittance (T2) of the light absorbing layer and the light transmittance (T3) of the diamond layer for light having a wavelength of 800 nm was 70%.

Separation of Diamond Layer

Next, YAG laser light having a wavelength of 1.06 μm was applied from the main surface of the diamond layer. The laser light was applied at a pulse interval of 40 μsec and a pulse width of 10 nsec and condensed so that the diameter of the light on the main surface was 30 μm. At this time, the focus of the laser light was located inside the light absorbing layer. The scan speed of the laser light was 25 mm/sec. The pulse output (A) of the laser light was varied in a range of not less than 1 μJ and less than 1 mJ. Namely, the irradiation fluence per pulse on the main surface of the diamond layer was not less than 1 J/mm$^2$ and not more than 1100 J/mm$^2$. The laser light was applied in a selected one of room temperature air (25° C.), cooled air (−5° C.), pure water (25° C.), and commercially available engine oil (25° C.). As a result of this, the substrate and the diamond layer were separated from each other. The time taken for the separation in the room temperature air is shown in Table 1.

TABLE 1

| | light absorbing layer | | | | conditions of laser irradiation | | | | | | |
| --- | --- | --- | --- | --- | --- | --- | --- | --- | --- | --- | --- |
| sample | kind of implanted ions | thickness (μm) | density of atomic vacancies (%) | light transmittance (@800 nm) T2/T1 | T2/T3 | wavelength (μm) | pulse output A(mJ) | pulse interval (μsec) | pulse width (nsec) | condensation size diameter (μm) | irradiation fluence (mJ/mm$^2$) | time for separation (min) |
| 1 | hydrogen ions | 0.07 | 0.2 | <100% | <100% | 1.06 | 0.01 ≤ A < 1 | 50 | 50 | 30 | 141 | 4 |
| 2 | nitrogen ions | 0.12 | 0.25 | <100% | <100% | 1.06 | 0.01 ≤ A < 1 | 50 | 50 | 30 | 141 | 15 |
| 3 | oxygen ions | 0.13 | 0.35 | <100% | <100% | 1.06 | 0.01 ≤ A < 1 | 50 | 50 | 30 | 141 | 8 |
| 4 | helium ions | 0.11 | 0.25 | <100% | <100% | 1.06 | 0.01 ≤ A < 1 | 50 | 50 | 30 | 141 | 4 |
| 5 | carbon ions | 0.11 | 0.3 | <100% | <100% | 1.06 | 0.01 ≤ A < 1 | 50 | 50 | 30 | 141 | 16 |
| 6 | hydrogen ions | 0.9 | 0.3 | <100% | <100% | 1.06 | 0.01 ≤ A < 1 | 50 | 50 | 30 | 141 | 4 |
| 7 | argon ions | 0.2 | 0.4 | <100% | <100% | 1.06 | 0.01 ≤ A < 1 | 50 | 50 | 30 | 141 | 5 |
| 8 | hydrogen ions | 0.07 | 2 | <100% | <100% | 1.06 | 1 ≤ A < 5 | 50 | 50 | 70 | 780 | 0.5 |
| 9 | nitrogen ions | 0.11 | 2.5 | <100% | <100% | 1.06 | 1 ≤ A < 5 | 50 | 50 | 70 | 780 | 4 |
| 10 | oxygen ions | 0.12 | 3.5 | <100% | <100% | 1.06 | 1 ≤ A < 5 | 50 | 50 | 70 | 780 | 1 |
| 11 | helium ions | 0.11 | 2.5 | <100% | <100% | 1.06 | 1 ≤ A < 5 | 50 | 50 | 70 | 780 | 0.5 |
| 12 | carbon ions | 0.11 | 3 | <100% | <100% | 1.06 | 1 ≤ A < 5 | 50 | 50 | 70 | 780 | 6 |
| 13 | hydrogen ions | 0.9 | 3 | <100% | <100% | 1.06 | 1 ≤ A < 5 | 50 | 50 | 70 | 780 | 0.5 |
| 14 | argon ions | 0.2 | 0.4 | <100% | <100% | 1.06 | 1 ≤ A < 5 | 50 | 50 | 70 | 780 | 0.8 |
| 15 | hydrogen ions | 0.07 | 20 | <100% | <100% | 1.06 | 5 ≤ A ≤ 50 | 50 | 50 | 300 | 283 | 0.6 |
| 16 | nitrogen ions | 0.11 | 28 | <100% | <100% | 1.06 | 5 ≤ A ≤ 50 | 50 | 50 | 300 | 283 | 5 |
| 17 | oxygen ions | 0.12 | 35 | <100% | <100% | 1.06 | 5 ≤ A ≤ 50 | 50 | 50 | 300 | 283 | 1 |
| 18 | helium ions | 0.11 | 25 | <100% | <100% | 1.06 | 5 ≤ A ≤ 50 | 50 | 50 | 300 | 283 | 0.5 |
| 19 | carbon ions | 0.11 | 31 | <100% | <100% | 1.06 | 5 ≤ A ≤ 50 | 50 | 50 | 300 | 283 | 7 |
| 20 | hydrogen ions | 0.9 | 30 | <100% | <100% | 1.06 | 5 ≤ A ≤ 50 | 50 | 50 | 300 | 283 | 0.6 |
| 21 | argon ions | 0.2 | 0.4 | <100% | <100% | 1.06 | 5 ≤ A ≤ 50 | 50 | 50 | 300 | 283 | 1 |
| 22 | hydrogen ions | 0.07 | 2 | <100% | <100% | 0.53 | 0.5 | 50 | 50 | 30 | 707 | 5 |
| 23 | nitrogen ions | 0.11 | 2.5 | <100% | <100% | 0.53 | 0.5 | 50 | 50 | 30 | 707 | 30 |
| 24 | oxygen ions | 0.12 | 3.5 | <100% | <100% | 0.53 | 0.5 | 50 | 50 | 30 | 707 | 10 |
| 25 | helium ions | 0.11 | 2.5 | <100% | <100% | 0.53 | 0.5 | 50 | 50 | 30 | 707 | 5 |
| 26 | carbon ions | 0.11 | 3 | <100% | <100% | 0.53 | 0.5 | 50 | 50 | 30 | 707 | 50 |
| 27 | hydrogen ions | 0.9 | 3 | <100% | <100% | 0.53 | 0.5 | 50 | 50 | 30 | 707 | 5 |
| 28 | argon ions | 0.2 | 0.4 | <100% | <100% | 1.06 | 0.5 | 50 | 50 | 30 | 707 | 6 |

TABLE 1-continued

| | | light absorbing layer | | | | conditions of laser irradiation | | | | | | |
|---|---|---|---|---|---|---|---|---|---|---|---|---|
| | kind of implanted | thickness | density of atomic vacancies | light transmittance (@800 nm) | | wave-length | pulse output | pulse interval | pulse width | condensation size diameter | irradiation fluence | time for separation |
| sample | ions | (μm) | (%) | T2/T1 | T2/T3 | (μm) | A(mJ) | (μsec) | (nsec) | (μm) | (mJ/mm²) | (min) |
| 29 | hydrogen ions | 0.07 | 2 | <100% | <100% | 10.6 | 250 | 3300 | 100 | 550 | 1052 | 0.2 |
| 30 | nitrogen ions | 0.11 | 2.5 | <100% | <100% | 10.6 | 250 | 3300 | 100 | 550 | 1052 | 2 |
| 31 | oxygen ions | 0.12 | 3.5 | <100% | <100% | 10.6 | 250 | 3300 | 100 | 550 | 1052 | 0.7 |
| 32 | helium ions | 0.11 | 2.5 | <100% | <100% | 10.6 | 250 | 3300 | 100 | 550 | 1052 | 0.2 |
| 33 | carbon ions | 0.11 | 3 | <100% | <100% | 10.6 | 250 | 3300 | 100 | 550 | 1052 | 3 |
| 34 | hydrogen ions | 0.9 | 3 | <100% | <100% | 10.6 | 250 | 3300 | 100 | 550 | 1052 | 0.2 |
| 35 | argon ions | 0.2 | 0.4 | <100% | <100% | 1.06 | 250 | 3300 | 100 | 550 | 1052 | 0.5 |

Evaluation

For the substrate and the diamond layer thus obtained, an evaluation was made based on the following standards.

A: As a result of observation with a common optical microscope at a magnification of 20×, no crack was generated in both the substrate and the diamond layer, and the separated surfaces had a surface roughness (Ra) of Ra≤0.1 μm.

B: No crack was generated in both the substrate and the diamond layer, and the separated surfaces had a surface roughness (Ra) of 0.1 μm<Ra<1 μm.

C: Crack was generated in at least one of the substrate and the diamond layer, or the separated surfaces had a surface roughness (Ra) of Ra≥1 μm.

Generation of cracks was observed with a common optical microscope at a magnification of 20×. The surface roughness was measured with a three-dimensional profiler of an optical microscope based on the principles of white light interferometry.

The sample irradiated with the laser light in the room temperature air was given B rating, and samples irradiated with the laser light in the cooled air, in the pure water, and in the oil were given A rating. The results are shown in Table 2.

Samples 2 to 35

For Samples 2 to 35, the substrate and the diamond layer were separated from each other by a similar method to Sample 1, except that the kind of ions implanted by ion implantation and the conditions for application of the laser light were those shown in Table 1 and Table 2. For Samples 11, 25, and 32, the laser light was applied from the main surface of the substrate, rather than the main surface of the diamond layer.

The substrate and the diamond layer thus obtained were evaluated based on similar standards to Sample 1. The results are shown in Table 2.

The samples irradiated with the laser light in the room temperature air were given B or C rating, and samples irradiated with the laser light in the cooled air, in the pure water, and in the oil were given A rating or B rating. The results are shown in Table 2.

TABLE 2

| | | sample | | | | | | | | | | | | | | | | |
|---|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 16 | 17 | 18 |
| laser irradiation environment | room temperature air (25° C.) | B | B | B | B | B | B | B | B | B | B | B | B | B | B | C | C | C | C |
| | cooled air (5° C.) | A | B | A | A | B | A | A | A | B | A | A | B | A | A | B | B | B | B |
| | pure water (25° C.) | A | A | A | A | A | A | A | A | A | A | A | A | A | A | B | A | A |
| | engine oil (25° C.) | A | A | A | A | A | A | A | A | A | A | A | A | A | A | A | A | A | A |

| | | sample | | | | | | | | | | | | | | | | |
|---|---|---|---|---|---|---|---|---|---|---|---|---|---|---|---|---|---|---|
| | | 19 | 20 | 21 | 22 | 23 | 24 | 25 | 26 | 27 | 28 | 29 | 30 | 31 | 32 | 33 | 34 | 35 |
| laser irradiation environment | room temperature air (25° C.) | C | C | C | B | B | B | B | B | B | B | B | B | B | B | B | B | B |
| | cooled air (5° C.) | B | B | B | A | B | B | A | B | A | A | A | A | A | A | A | A | A |
| | pure water (25° C.) | B | A | A | A | A | A | A | A | A | A | A | A | A | A | A | A | A |
| | engine oil (25° C.) | B | A | A | A | A | A | A | A | A | A | A | A | A | A | A | A | A |

EXAMPLE 2

Sample 36

A substrate similar to Sample 1 was prepared, and a light absorbing layer and a diamond layer were formed by a similar method to Sample 1.

Separation of Diamond Layer

Next, flash lamp light was applied from the main surface of the diamond layer. The flash lamp light was xenon flash lamp light, the xenon flash lamp light was condensed to a diameter of 5 mm, the light with a wavelength of less than 500 nm and the light with a wavelength of more than 1.25 μm were cut off to selectively use the light having a wavelength of not less than 500 nm and not more than 1.25 μm. The flash lamp light was physically cut off so that the pulse interval was 8 msec, the pulse width was 1 μsec, and the diameter on the main surface was 1 mm. Further, the light condensed to 0.1 mm was applied. At this time, the focus of the flash lamp light was located inside the light absorbing layer. The scan speed of the flash lamp light (actually the sample was moved) was 10 mm/sec. The pulse output (A) of the flash lamp light was varied in a range of not less than 250 mJ and less than 10 J. Namely, the irradiation fluence per pulse width of 1 msec on the main surface of the diamond layer was not less than 100 mJ/mm$^2$ and not more than 1000 mJ/mm$^2$. The flash lamp light was applied in a selected one of room temperature air (25° C.), cooled air (−5° C.), pure water (25° C.), and commercially available engine oil (25° C.). As a result of this, the substrate and the diamond layer were separated from each other. The time taken for the separation in the room temperature air is shown in Table 3.

TABLE 3

| | light absorbing layer | | | | conditions of flash lamp irradiation | | | | | |
|---|---|---|---|---|---|---|---|---|---|---|
| sample | kind of implanted ions | thickness (μm) | density of atomic vacancies (%) | light transmittance (@800 nm) | | pulse output A(mJ) | pulse interval (msec) | pulse width (μsec) | condensation size diameter (mm) | irradiation fluence (mJ/mm$^2$) | time for separation (min) |
| | | | | T2/T1 | T2/T3 | | | | | | |
| 36 | hydrogen ions | 0.07 | 2 | <100% | <100% | 1 < A < 10 | 8 | 1 | 0.1 | 637 | 10 |
| 37 | nitrogen ions | 0.11 | 2.5 | <100% | <100% | 1 < A < 10 | 8 | 1 | 0.1 | 637 | 20 |
| 38 | oxygen ions | 0.12 | 3.5 | <100% | <100% | 1 < A < 10 | 8 | 1 | 0.1 | 637 | 12 |
| 39 | helium ions | 0.11 | 2.5 | <100% | <100% | 1 < A < 10 | 8 | 1 | 0.1 | 637 | 10 |
| 40 | carbon ions | 0.11 | 3 | <100% | <100% | 1 < A < 10 | 8 | 1 | 0.1 | 637 | 50 |
| 41 | hydrogen ions | 0.9 | 3 | <100% | <100% | 1 < A < 10 | 8 | 1 | 0.1 | 637 | 10 |
| 42 | argon ions | 0.2 | 0.4 | <100% | <100% | 1 < A < 10 | 8 | 1 | 0.1 | 637 | 15 |
| 43 | hydrogen ions | 0.07 | 2 | <100% | <100% | 10 ≤ A < 100 | 8 | 1 | 1 | 102 | 50 |
| 44 | nitrogen ions | 0.11 | 2.5 | <100% | <100% | 10 ≤ A < 100 | 8 | 1 | 1 | 102 | 100 |
| 45 | oxygen ions | 0.12 | 3.5 | <100% | <100% | 10 ≤ A < 100 | 8 | 1 | 1 | 102 | 55 |
| 46 | helium ions | 0.11 | 2.5 | <100% | <100% | 10 ≤ A < 100 | 8 | 1 | 1 | 102 | 50 |
| 47 | carbon ions | 0.11 | 3 | <100% | <100% | 10 ≤ A < 100 | 8 | 1 | 1 | 102 | 200 |
| 48 | hydrogen ions | 0.9 | 3 | <100% | <100% | 10 ≤ A < 100 | 8 | 1 | 1 | 102 | 50 |
| 49 | argon ions | 0.2 | 0.4 | <100% | <100% | 10 ≤ A < 100 | 8 | 1 | 1 | 102 | 60 |

Evaluation

For the substrate and the diamond layer thus obtained, an evaluation was made based on similar standards to Sample 1. The results are shown in Table 4.

TABLE 4

| | | sample | | | | | | | | | | | | | |
|---|---|---|---|---|---|---|---|---|---|---|---|---|---|---|---|
| | | 36 | 37 | 38 | 39 | 40 | 41 | 42 | 43 | 44 | 45 | 46 | 47 | 48 | 49 |
| flash lamp irradiation environment | room temperature air (25° C.) | B | C | C | B | C | B | B | B | C | C | B | C | B | B |
| | cooled air (5° C.) | A | B | B | A | B | A | A | A | B | B | A | B | A | A |
| | pure water (25° C.) | A | A | A | A | A | A | A | A | A | A | A | A | A | A |
| | engine oil (25° C.) | A | A | A | A | A | A | A | A | A | A | A | A | A | A |

The sample irradiated with the flash lamp light in the room temperature air was given B rating, and the samples irradiated with it in the cooled air, in the pure water, and in the oil were given A rating.

Samples 37 to 49

For Samples 37 to 49, the substrate and the diamond layer were separated from each other by a similar method to Sample 36, except that the kind of ions implanted by ion implantation and the conditions for application of the flash lamp light were those shown in Table 3 and Table 4.

The substrate and the diamond layer thus obtained were evaluated based on similar standards to Sample 36. The results are shown in Table 4.

The samples irradiated with the flash lamp light in the room temperature air were given B rating or C rating, the samples irradiated with it in the cooled air were given A rating, or B rating, and the samples irradiate with it in the pure water and the oil were given A rating.

EXAMPLE 3

Samples 51 to 64

For Samples 51 to 55 and Samples 58 to 62, the light absorbing layer and the diamond layer were formed on the substrate by a similar method to Samples 1 to 5 in Example 1. For Samples 56, 57, the light absorbing layer and the diamond layer were formed on the substrate by a similar method to Example 1, except for the kind of implanted ions.

For the above-indicated samples, an experiment on the separation was conducted under conditions of laser irradiation shown in Table 5. The pulse width of the laser was 12 psec or 0.01 psec, and the laser irradiation was performed in only the pure water.

present example. In the case of a shorter pulse interval like Samples 58 to 64, the separation was more adequately accomplished with a smaller irradiation fluence. For the same samples, the pulse with a pulse interval of 0.006 psec could not prevent cracks.

EXAMPLE 4

Samples 65-72

Preparation of Substrate

A Type Ib substrate (commercially available product) produced by high-temperature high-pressure synthesis was used, the surface had a roughness Ra of about 7 nm, and the direction of off angle 3° conformed to the direction of periodicity of the surface roughness were matched within 20°.

Formation of Light Absorbing Layer

In the present example, a light absorbing layer was formed by the microwave plasma CVD method. The substrate was placed in a vacuum chamber of a microwave plasma CVD apparatus. Then, the substrate was heated to a temperature of 1000° C., the pressure in the vacuum chamber was adjusted to 90 Torr, and thereafter hydrogen gas and methane gas were introduced into the vacuum chamber to perform microwave plasma CVD method and thereby form a light absorbing layer with a thickness of 10 μm or less on the substrate. The ratio (vol %) between the gases at this time was:

hydrogen gas:methane gas=100:18.

In the case where different-kind atoms were added, 0.01% or more of gas of the different-kind atoms relative to the methane gas was added to the gas.

TABLE 5

| | | light absorbing layer | | light | | conditions of laser irradiation | | | | | | |
|---|---|---|---|---|---|---|---|---|---|---|---|---|
| | | | | | | | | | | condensation | | |
| sample | kind of implanted ions | thickness (μm) | density of vacancies (%) | transmittance (@800 nm) T2/T1 | T2/T3 | wavelength (μm) | pulse output A(mJ) | pulse interval (msec) | pulse width (μsec) | size diameter (μm) | irradiation fluence (mJ/mm²) | time for separation (min) |
| 51 | hydrogen ions | 0.07 | 0.2 | <100% | <100% | 1.06 | 0.01 ≤ A < 1 | 2 | 12 | 30 | 141 | 120 |
| 52 | nitrogen ions | 0.12 | 0.25 | <100% | <100% | 1.06 | 0.01 ≤ A < 1 | 2 | 12 | 30 | 141 | 410 |
| 53 | oxygen ions | 0.13 | 0.35 | <100% | <100% | 1.06 | 0.01 ≤ A < 1 | 2 | 12 | 30 | 141 | 280 |
| 54 | helium ions | 0.11 | 0.25 | <100% | <100% | 1.06 | 0.01 ≤ A < 1 | 2 | 12 | 30 | 141 | 140 |
| 55 | carbon ions | 0.11 | 0.3 | <100% | <100% | 1.06 | 0.01 ≤ A < 1 | 2 | 12 | 30 | 141 | 105 |
| 56 | boron ions | 0.1 | 0.3 | <100% | <100% | 1.06 | 0.01 ≤ A < 1 | 2 | 12 | 30 | 141 | 95 |
| 57 | phosphorus ions | 0.2 | 0.4 | <100% | <100% | 1.06 | 0.01 ≤ A < 1 | 2 | 12 | 30 | 141 | 80 |
| 58 | hydrogen ions | 0.07 | 0.2 | <100% | <100% | 1.06 | 0.01 ≤ A < 1 | 0.3 | 0.01 | 50 | 51 | 150 |
| 59 | nitrogen ions | 0.12 | 0.25 | <100% | <100% | 1.06 | 0.01 ≤ A < 1 | 0.3 | 0.01 | 50 | 51 | 450 |
| 60 | oxygen ions | 0.13 | 0.35 | <100% | <100% | 1.06 | 0.01 ≤ A < 1 | 0.3 | 0.01 | 50 | 51 | 310 |
| 61 | helium ions | 0.11 | 0.25 | <100% | <100% | 1.06 | 0.01 ≤ A < 1 | 0.3 | 0.01 | 50 | 51 | 180 |
| 62 | carbon ions | 0.11 | 0.3 | <100% | <100% | 1.06 | 0.01 ≤ A < 1 | 0.3 | 0.01 | 50 | 51 | 95 |
| 63 | boron ions | 0.1 | 0.3 | <100% | <100% | 1.06 | 0.01 ≤ A < 1 | 0.3 | 0.01 | 50 | 51 | 80 |
| 64 | phosphorus ions | 0.2 | 0.4 | <100% | <100% | 1.06 | 0.01 ≤ A < 1 | 0.3 | 0.01 | 50 | 51 | 75 |

All of the samples required a longer time for the separation, as compared with Example 1. However, for all of the samples, separation was accomplished with the kinds of implanted ions shown in Table 5. In the case where boron ions or phosphorus ions were implanted, the separation was adequately accomplished with a shorter pulse width as in the Formation of Diamond Layer Next, the substrate on which the light absorbing layer was formed was heated to a temperature of 1100° C. or more, the concentration of methane gas was adjusted to 8% or less, and a diamond layer with a high light transmittance having a thickness of 500 was formed on the substrate. The fact that a higher light transmittance is achieved under this condition had been confirmed by comparison with formation of the diamond layer grown on the substrate without the light absorbing layer.

Separation of Diamond Layer

An experiment was conducted in which laser light was applied thorough the surface of the diamond layer of the produced sample so as to separate the diamond layer. The conditions for the irradiation with laser light are shown in Table 6.

TABLE 6

| | light absorbing layer | | | | | |
|---|---|---|---|---|---|---|
| sample | contained different-kind atoms | thickness (μm) | different-kind atoms bonded to carbon of lattice (ppm) | density of different-kind atoms (SIMS) (ppm) | density of atomic vacancies (%) | light transmittance (@800 nm) | |
| | | | | | | T2/T1 | T2/T3 |
| 65 | hydrogen | 8 | 10 | 100 | 0.5 | <100% | <100% |
| 66 | hydrogen | 5 | 5 | 100 | 0.6 | <100% | <100% |
| 67 | nitrogen | 6 | 0.8 | 80 | 0.3 | <100% | <100% |
| 68 | nitrogen | 3 | 0.2 | 90 | 0.4 | <100% | <100% |
| 69 | helium | 7 | 0 | 10 | 0.01 | <100% | <100% |
| 70 | helium | 5 | 0 | 10 | 0.01 | <100% | <100% |
| 71 | argon | 7 | 0 | 5 | 0.03 | <100% | <100% |
| 72 | argon | 5 | 0 | 5 | 0.03 | <100% | <100% |

| | conditions of laser irradiation | | | | | |
|---|---|---|---|---|---|---|
| sample | wavelength (μm) | pulse output A(mJ) | pulse interval (μsec) | pulse width (nsec) | condensation size diameter (μm) | irradiation fluence (mJ/mm$^2$) | time for separation (min) |
| 65 | 1.06 | 0.01 ≤ A < 1 | 5 | 10 | 10 | 1273 | 22 |
| 66 | 1.06 | 0.01 ≤ A < 1 | 200 | 10 | 50 | 51 | 68 |
| 67 | 1.06 | 0.01 ≤ A < 1 | 5 | 10 | 10 | 1273 | 46 |
| 68 | 1.06 | 0.01 ≤ A < 1 | 200 | 10 | 50 | 51 | 78 |
| 69 | 1.06 | 0.01 ≤ A < 1 | 5 | 10 | 10 | 1273 | 31 |
| 70 | 1.06 | 0.01 ≤ A < 1 | 200 | 10 | 50 | 51 | 52 |
| 71 | 1.06 | 0.01 ≤ A < 1 | 5 | 10 | 10 | 1273 | 23 |
| 72 | 1.06 | 0.01 ≤ A < 1 | 200 | 10 | 50 | 51 | 38 |

Results

In the case where the light absorbing layer was formed by the microwave plasma CVD method, the separation could be accomplished by the laser light. Atomic vacancies were calibrated based on the results of ion implantation and evaluated based on disappearance of positively-charged electrons. In the case where the atomic vacancies in the light absorbing layer were less than 0.01% or in the case where different-kind atoms which did not bond with carbon in the crystal lattice were less than 0.1 ppm, the separation was impossible under the present condition. Moreover, in the case where the irradiation fluence of the pulse was increased to more than 800 J/mm$^2$, there was a problem that the diamond layer or the substrate was broken before the separation, namely the separation in a proper state was impossible.

EXAMPLE 5

Samples 73-82

Preparation of Substrate and Formation of Light Absorbing Layer

By a similar method to Sample 1, a light absorbing layer was formed on a substrate. For Sample 80, a substrate in the (111) plane orientation was used. For the other samples, a substrate in the (100) plane orientation was used. For Sample 76, a mosaic monocrystalline substrate was used. The size of the substrate is shown in Table 7.

TABLE 7

| sample | layer formed on light absorbing layer | material for joint | substrate size | diamond layer thickness (μm) | separated plate | warp of substrate |
|---|---|---|---|---|---|---|
| 73 | boron-doped layer | — | 6 mmφ | 200 | single boron-doped layer | 40 μm/10 mm |
| 74 | boron-doped layer | — | 6 mmφ | 50 | single boron-doped layer | 100 μm/10 mm |
| 75 | non-doped layer | — | 12 × 12 mm, 12 mmφ [*1] | 200 | single non-doped layer | 50 μm/10 mm |
| 76 | non-doped layer, mosaic single crystal | — | 16 × 16 mm, 16 mmφ [*1] | 500 | single non-doped layer | 30 μm/10 mm |
| 77 | nitrogen-doped layer | — | 12 × 12 mm, 12 mmφ [*1] | 300 | single nitrogen-doped layer | 51 μm/10 mm |
| 78 | molybdenum metal on non-doped layer | Ti/AuSn | 4 mmφ | 40 | molybdenum plate to which non-doped layer is joined | 80 μm/10 mm |
| 79 | tungsten metal on non-doped layer | Ti/In | 7 mmφ | 10 | tungsten plate to which non-doped layer is joined | 60 μm/10 mm |
| 80 | quartz substrate on phosphorus-doped layer | SOG | 3 mmφ | 5 | quartz substrate on non-doped layer | 10 μm/10 mm |
| 81 | quartz substrate on non-doped layer | Ti/SiO$_2$ | 4 mmφ | 1 | quartz substrate on non-doped layer | 21 μm/10 mm |
| 82 | quartz substrate on non-doped layer | resin | 6 mmφ | 100 | quartz substrate on non-doped layer | 20 μm/10 mm |

[*1] both are implemented

Formation of Diamond Layer

Next, the substrate on which the light absorbing layer was formed was placed in a vacuum chamber of a microwave plasma CVD apparatus so that the main surface of the light absorbing layer was exposed. Then, the substrate was heated to a temperature of 800° C., the pressure in the vacuum chamber was adjusted to 13.3 kPa, and thereafter a gas mixture composed of hydrogen gas, methane gas, and nitrogen gas as well as an impurity gas serving as a dopant were introduced into the vacuum chamber to perform the microwave plasma CVD method and thereby form a monocrystalline diamond layer having a thickness shown in Table 7 on the substrate.

A boron-doped monocrystalline diamond layer for Samples 73, 74 (indicated as "boron-doped layer" in Table 7) was synthesized by using a gas containing a gas mixture at a methane concentration of 8% and diborane gas at a concentration of 100 ppm relative to the methane gas. Although somewhat blue-blackish, a diamond layer with electrical conductivity (several Ωcm) was formed.

For Samples 75, 76, a diamond layer with a high optical transparency was formed by a similar method to Example 1. For Sample 76, a mosaic single crystal was formed.

For Sample 77, a diamond layer was fabricated under the same conditions as the high-light-transmittance diamond layer of Example 1, except that 0.01% of nitrogen was added to the methane gas. While somewhat colored, a diamond layer with electrical conductivity of $10^{10}$ Ωcm or more at room temperature was obtained. Warp was considerably small.

For Samples 78, 79, a high-light-transmittance diamond layer was formed by a method similar to Example 1, and a metal was joined onto the diamond layer. Ti was vapor-deposited on the diamond layer, the metal wettability was improved, and thereafter a generally-used solder material was melted on a hot plate and joined.

For Sample 80, a diamond layer was formed under a phosphorous doping condition. The resistivity was about $10^3$ Ωcm. To the surface of the diamond layer, a common SOG was applied, quartz was laid thereon, and they were baked for joining.

For Sample 81, Ti was vapor-deposited to 100 nm on a non-doped diamond layer (indicated as "non-doped layer" in Table 7) identical to Sample 78, SiO$_2$ was formed to approximately 5 μm by the CVD method, polishing for planarization was performed, and it was physically joined to a planarized quartz substrate.

For sample 82, a quartz substrate was joined onto a non-doped diamond layer identical to Sample 78, with a resin of the double-liquid hardening type therebetween.

Separation of Diamond Layer

For all samples, light was applied from the substrate side, and the separation was done in pure water.

Results

For all samples, the separation was completed within 30 minutes.

For all samples, any of (a) a diamond crack with a length of 1 to 10 μm, (b) a graphite layer with a maximum diameter of 5 to 50 μm, and (c) a graphite layer of an indefinite shape with a length of 200 μm to 4 mm was confirmed in the separated surface of the diamond layer. Although a combination of (a) and (c) or a combination of (b) and (c) did not occur, a combination of (a) and (b) was present. The graphite layer of (b) or (c) was circular in some cases, and three or four such graphite layers were aligned in many cases. In contrast, in the graphite layer of (c), a circular region with a diameter of 100 μm was missing to expose the diamond layer in some cases, and such regions were also aligned in many cases as well. The surface unevenness of a region where substantially no graphite layer was present was examined, and it was found that the surface was depressed in a circular shape and such circular depressions were aligned. The depth of the depressions was in a range of 50 to 200 nm. After Ti was vapor-deposited on the separated surface, it was connected to a different-kind metal by AuSn solder or the like. In this case, good strength of connection was maintained, and there was a less frequency of disconnection as compared with common diamond joint.

The RHEED pattern and the RBS channeling characteristic of the separated surface were examined. Then, it was found that the pattern width was 1.5 times as large as the high-pressure Type Ib single crystal, and the chi minimum value of the channeling characteristic was 10%, namely crystal fluctuation was large. When hydrogen/oxygen plasma etching of approximately 1 to 2 μm was performed, the pattern width was 1.4 times and the chi minimum value was 9% and thus a significant change did not occur. Namely, the crystal strain of the light absorbing layer was transferred to the separated surface.

Samples for Reference

As samples for reference, samples which were identical to Samples 73 to 82 respectively except that carbon ions were implanted and the separation was done by electrochemical etching were prepared.

For all reference samples, the separation was impossible even after two weeks. It appears that the electrically conductive samples did not allow penetration of electric field of electrochemical etching and thus the separation was impossible. It appears that samples with a small warp and a large size did not allow penetration of the liquid and thus the separation was impossible. In the case of a joint material which was susceptible to electric field or the acid or alkali, the joint material was corroded and detached.

EXAMPLE 6

Preparation of Substrate

In the present example, polycrystalline diamond with an average grain size of 30 μm to 300 μm in the surface was prepared for use as a substrate. The substrates of 25 mmφ, 50 mmφ, 75 mmφ, 100 mmφ, and 150 mmφ in size were prepared.

Formation of Light Absorbing Layer

By a similar method to Sample 1, ions were implanted to form a light absorbing layer.

Formation of Diamond Layer

On the substrate, a diamond layer was formed under polycrystal synthesis conditions. On the substrates of 50 mmφ or less, the diamond layer was grown to a thickness of 400 μm by the microwave plasma CVD method. On the substrates of 75 mmφ or more, the diamond layer was grown to a thickness of 30 μm by the hot filament method. The methane concentration in the gas mixture was 5%, the pressure was 110 Torr, and the substrate temperature was 950° C. Since the substrates of 75 mmφ or more were thin and apt to break when separated, quartz was joined after SOG coating for the sake of reinforcement. Since the average grain size of the substrate was sufficiently large, the average grain size of the diamond layer was not considerably increased even when the diamond layer with a high light transmittance was formed, and the average grain size was only approximately 1.1 to 1.2 times.

Separation of Diamond Layer

Under similar laser irradiation conditions to Sample 1, the separation was done. For any samples, the separation could be accomplished within two hours. There was substantially no difference in grain size between the front side and the back side of the substrate, there was substantially no warp, and the vertical displacement per 10 mm was 100 μm/10 mm or less.

EXAMPLE 7

Sample 1 was processed into a cutting tool bit, before separation of the diamond layer. After the sample was used as the cutting tool bit, light was applied from the surface to the ion implantation layer in the state where the tool bit was attached to the tool (shank), and the surface could be separated. The separation exposed a new face and the sample could be used again as a tool bit. Multiple ion implantation layers can be formed to repeatedly expose a new face by shifting the focus of the light.

EXAMPLE 8

The separated monocrystalline diamond layer of Sample 1 was used to fabricate a drawing die. Even a diamond layer which was separated by laser irradiation after ion implantation could be used for the drawing die.

EXAMPLE 9

A composite body with the diamond layer having the structure fabricated for Example 5 was used as a heat sink. A semiconductor laser chip was joined to the diamond layer and the laser was energized. Then, operation at a lower temperature than the case without diamond could be accomplished.

It should be construed that the embodiments and examples disclosed herein are given by way of illustration in all respects, not by way of limitation. It is intended that the scope of the present invention is defined by claims, not by the description above, and encompasses all modifications and variations equivalent in meaning and scope to the claims.

INDUSTRIAL APPLICABILITY

The diamond of the present invention is useful when applied to tools such as cutting tool, grinding tool, and wear-resistant tool, and additionally various products such as optics, semiconductor, and electronic component.

REFERENCE SIGNS LIST

1, 21 substrate; 1*a* part of substrate; 2, 22 light absorbing layer; 3, 23 diamond layer; 4, 24 light

The invention claimed is:
1. A diamond comprising:
   a diamond layer; and
   a light absorbing layer disposed on one surface of the diamond layer and different in optical transparency from the diamond layer,
   a surface of the light absorbing layer including at least one of
      a diamond crack having a length of not more than 100 μm,
      a graphite layer having a maximum diameter of not more than 100 μm, and
      a graphite layer having a length of not less than 200 μm, wherein
   the diamond has a vertical displacement per 10 mm of not more than 100 μm, and has a size of a main surface of not less than 12 mm in diameter.
2. The diamond according to claim 1, wherein
   the diamond includes a layer having a resistivity of not less than $10^{-4}$ Ωcm and less than $10^9$ Ωcm and having a thickness of not less than 1 μm.
3. The diamond according to claim 1, wherein
   in the diamond which is a single freestanding body, a difference between an average diamond crystal grain size in one main surface of the diamond and an average diamond crystal grain size in the other main surface of the diamond is not more than 50% of a larger one of the average diamond crystal grain size in the one main surface and the average diamond crystal grain size in the other main surface.

4. A diamond composite substrate comprising:
a diamond as recited in claim 1; and
a different-kind substrate attached to the diamond, the different-kind substrate being a substrate of a material different from diamond.

5. A tool for which a diamond as recited in claim 1 is used.

* * * * *